(12) United States Patent
Tzeng et al.

(10) Patent No.: US 11,855,169 B2
(45) Date of Patent: Dec. 26, 2023

(54) SILICIDE STRUCTURES IN TRANSISTORS AND METHODS OF FORMING

(71) Applicant: Taiwan Semiconductor Manufacturing Co., Ltd., Hsinchu (TW)

(72) Inventors: Kai-Di Tzeng, Hsinchu (TW); Chen-Ming Lee, Yangmei (TW); Fu-Kai Yang, Hsinchu (TW); Mei-Yun Wang, Chu-Pei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/826,673

(22) Filed: May 27, 2022

(65) Prior Publication Data

US 2022/0293761 A1 Sep. 15, 2022

Related U.S. Application Data

(62) Division of application No. 16/881,384, filed on May 22, 2020, now Pat. No. 11,349,005.

(51) Int. Cl.
| | |
|---|---|
| *H01L 29/45* | (2006.01) |
| *H01L 29/78* | (2006.01) |
| *H01L 29/417* | (2006.01) |
| *H01L 21/8238* | (2006.01) |
| *H01L 27/092* | (2006.01) |
| *H01L 29/40* | (2006.01) |

(52) U.S. Cl.
CPC ...... *H01L 29/45* (2013.01); *H01L 21/823814* (2013.01); *H01L 21/823821* (2013.01); *H01L 27/0924* (2013.01); *H01L 29/401* (2013.01); *H01L 29/41791* (2013.01); *H01L 29/785* (2013.01)

(58) Field of Classification Search
CPC ..... H01L 21/823418; H01L 21/823821; H01L 21/823814; H01L 29/41791
See application file for complete search history.

(56) References Cited

U.S. PATENT DOCUMENTS

| 5,639,678 A | 6/1997 | Lee et al. |
|---|---|---|
| 9,105,490 B2 | 8/2015 | Wang et al. |
| 9,236,267 B2 | 1/2016 | De et al. |

(Continued)

FOREIGN PATENT DOCUMENTS

| JP | 2002184717 A | 6/2002 |
|---|---|---|
| KR | 20170042938 A | 4/2017 |

(Continued)

*Primary Examiner* — Bac H Au
(74) *Attorney, Agent, or Firm* — Slater Matsil, LLP

(57) ABSTRACT

A device includes a gate stack; a gate spacer on a sidewall of the gate stack; a source/drain region adjacent the gate stack; a silicide; and a source/drain contact electrically connected to the source/drain region through the silicide. The silicide includes a conformal first portion in the source/drain region, the conformal first portion comprising a metal and silicon; and a conformal second portion over the conformal first portion, the conformal second portion further disposed on a sidewall of the gate spacer, the conformal second portion comprising the metal, silicon, and nitrogen.

20 Claims, 31 Drawing Sheets

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,468,500 B1* | 11/2019 | Tsai ................ H01L 21/823814 |
| 10,868,181 B2 | 12/2020 | Li et al. |
| 10,879,126 B2 | 12/2020 | More et al. |
| 11,107,690 B2 | 8/2021 | Hung et al. |
| 11,195,923 B2 | 12/2021 | Thareja et al. |
| 2002/0061639 A1 | 5/2002 | Itonaga |
| 2016/0233164 A1 | 8/2016 | Choi et al. |
| 2016/0351570 A1 | 12/2016 | Park et al. |
| 2017/0103948 A1 | 4/2017 | Lee et al. |
| 2017/0221890 A1 | 8/2017 | Wang et al. |
| 2018/0174913 A1* | 6/2018 | More ................ H01L 29/66795 |
| 2019/0097006 A1* | 3/2019 | Li ..................... H01L 29/41725 |
| 2019/0109043 A1 | 4/2019 | Wang et al. |
| 2019/0157269 A1* | 5/2019 | Koh .................... H01L 29/7848 |
| 2019/0164835 A1 | 5/2019 | Lu et al. |
| 2020/0043805 A1 | 2/2020 | Wang et al. |
| 2020/0098572 A1 | 3/2020 | Wang et al. |
| 2020/0126984 A1 | 4/2020 | Liu et al. |
| 2020/0176260 A1* | 6/2020 | Hung ................ H01L 21/02274 |
| 2020/0176262 A1 | 6/2020 | Camagong et al. |
| 2020/0273966 A1 | 8/2020 | Cheng et al. |
| 2020/0279943 A1 | 9/2020 | Niimi |
| 2021/0091078 A1 | 3/2021 | Lu et al. |
| 2021/0343590 A1 | 11/2021 | Chang et al. |

FOREIGN PATENT DOCUMENTS

| | | |
|---|---|---|
| KR | 20180007351 A | 1/2018 |
| KR | 20180079161 A | 7/2018 |
| KR | 20190099990 A | 8/2019 |
| KR | 20200006947 A | 1/2020 |
| TW | 202029504 A | 8/2020 |

* cited by examiner

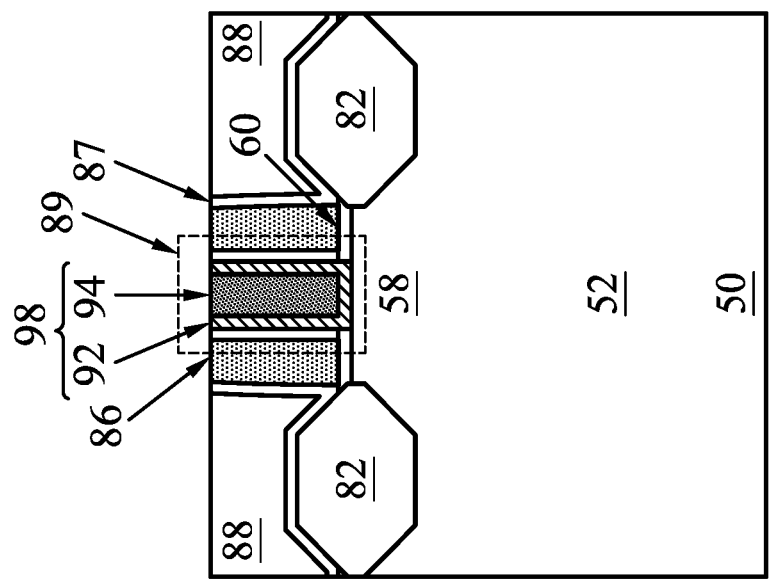
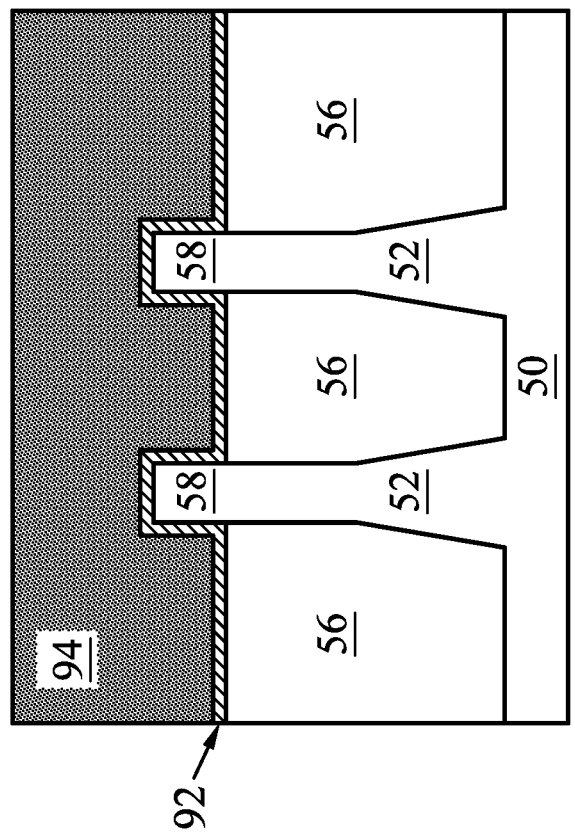
Figure 14B
Figure 14A

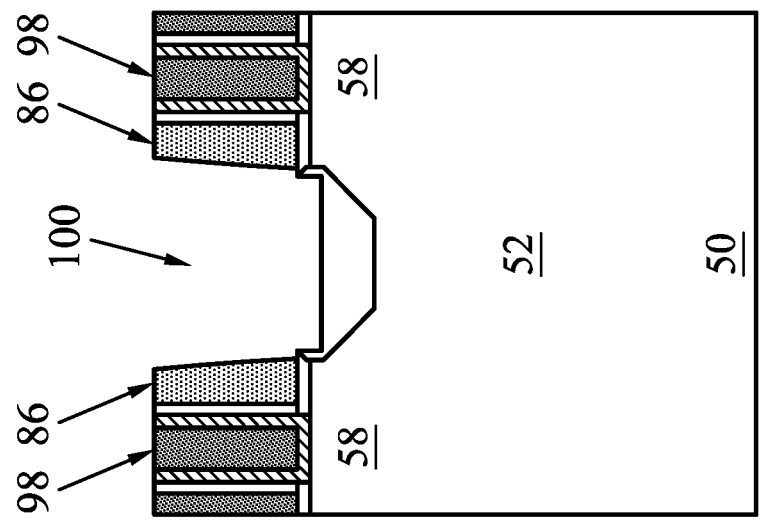
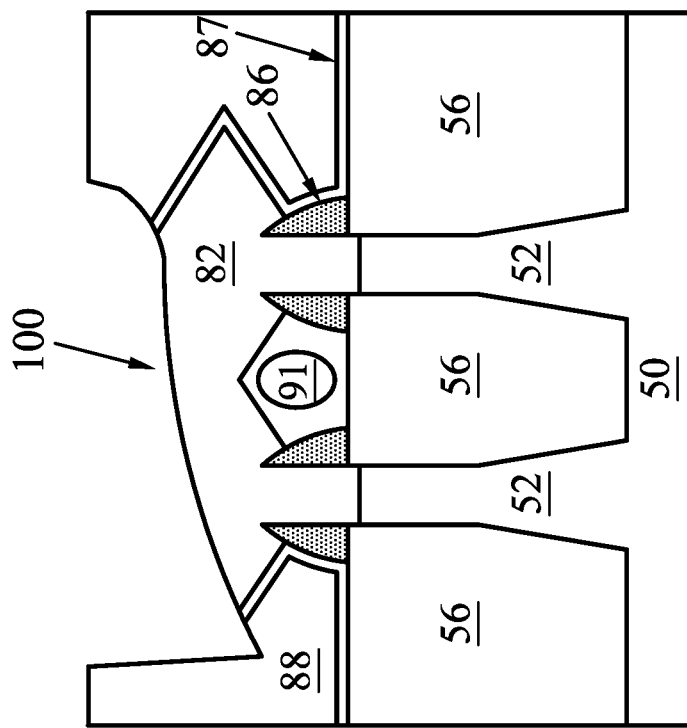
Figure 16A
Figure 16B

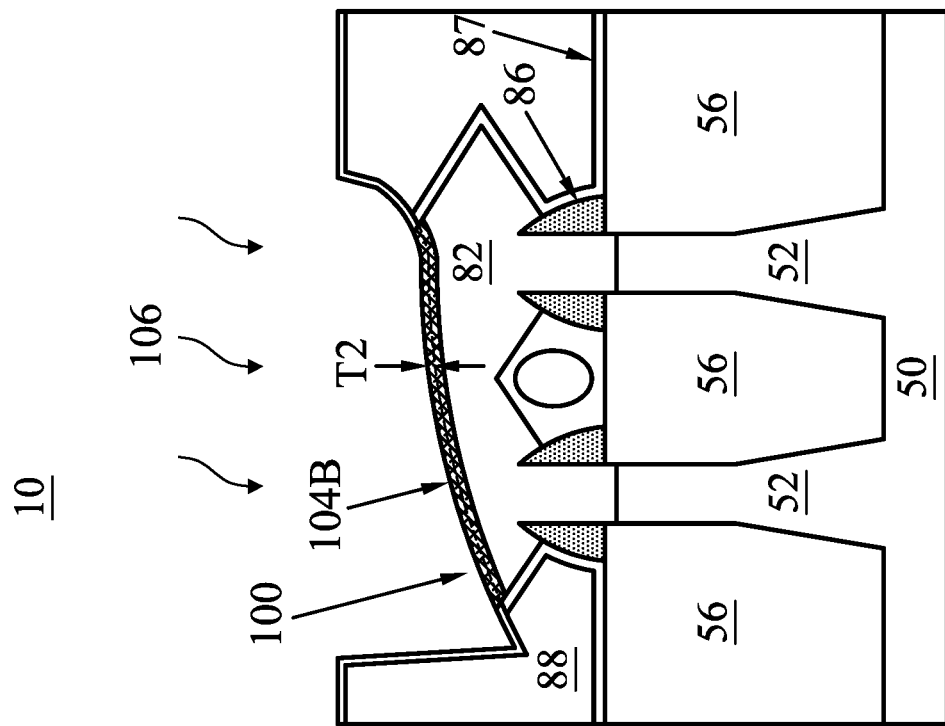
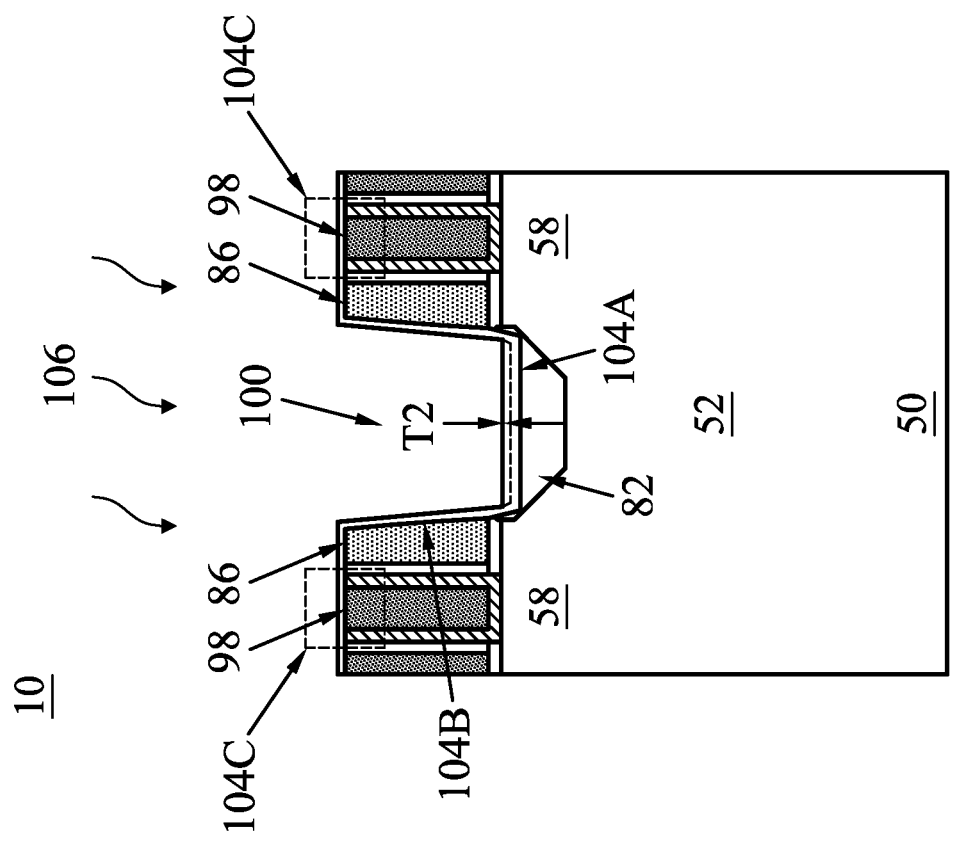
Figure 18B
Figure 18A

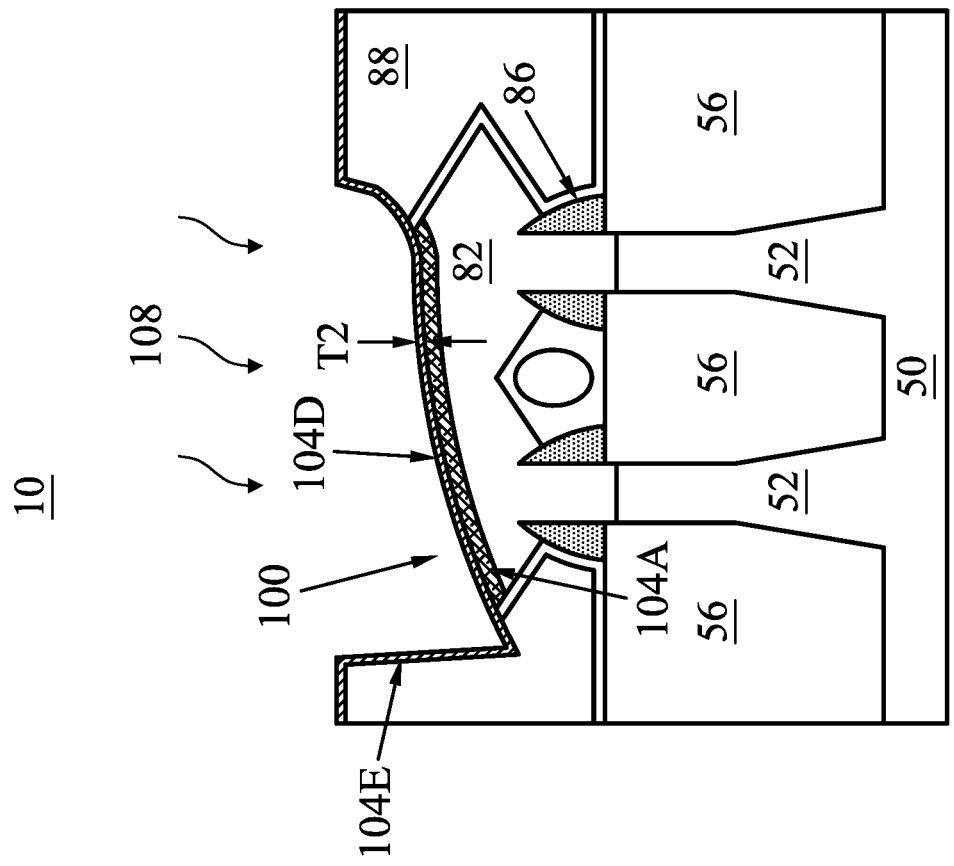
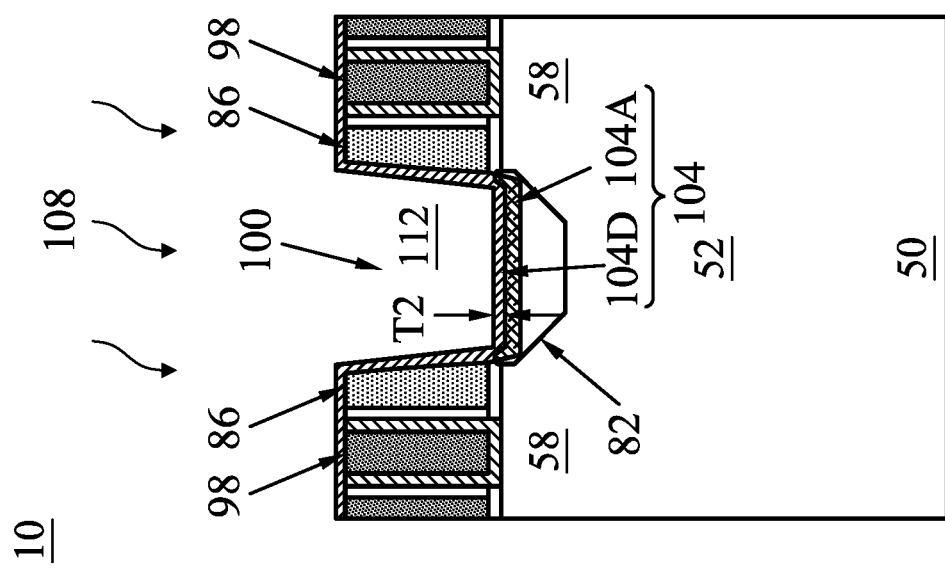
Figure 19B
Figure 19A

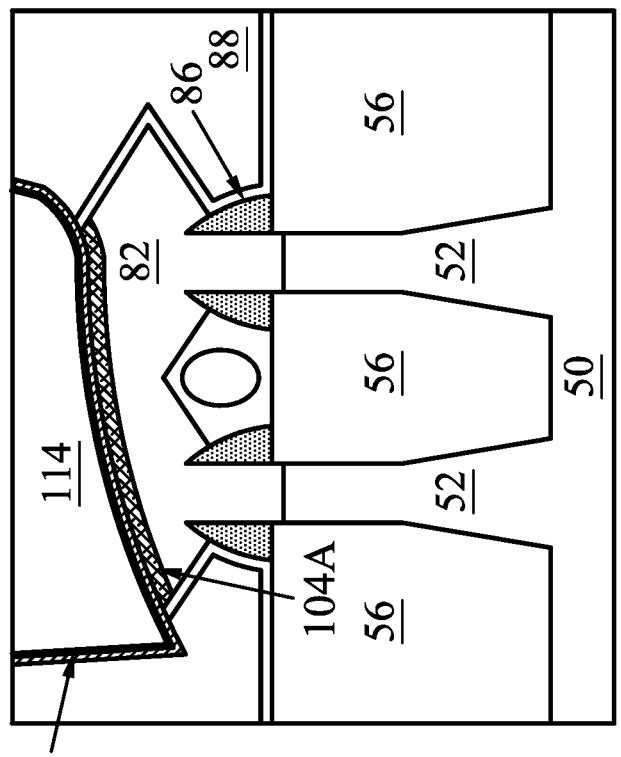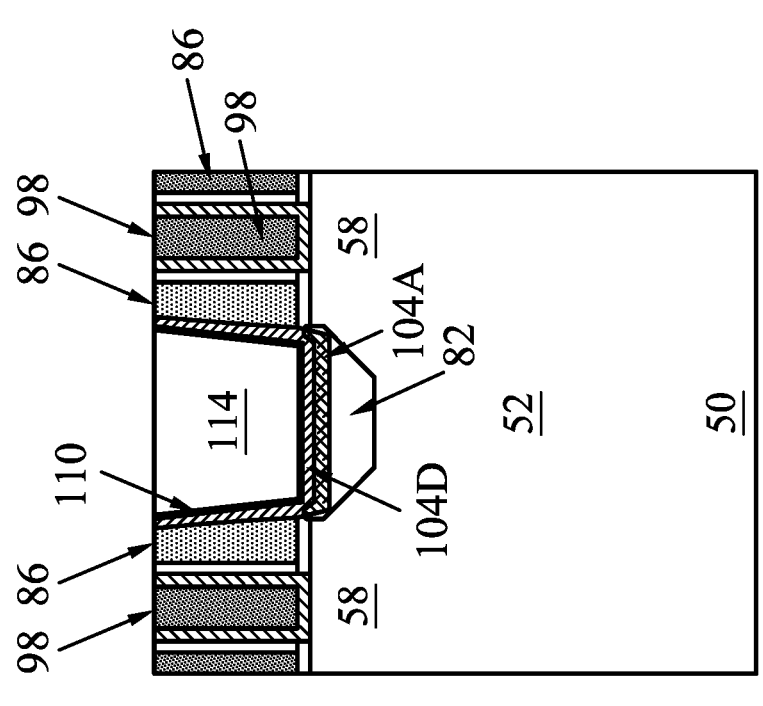
Figure 21A
Figure 21B

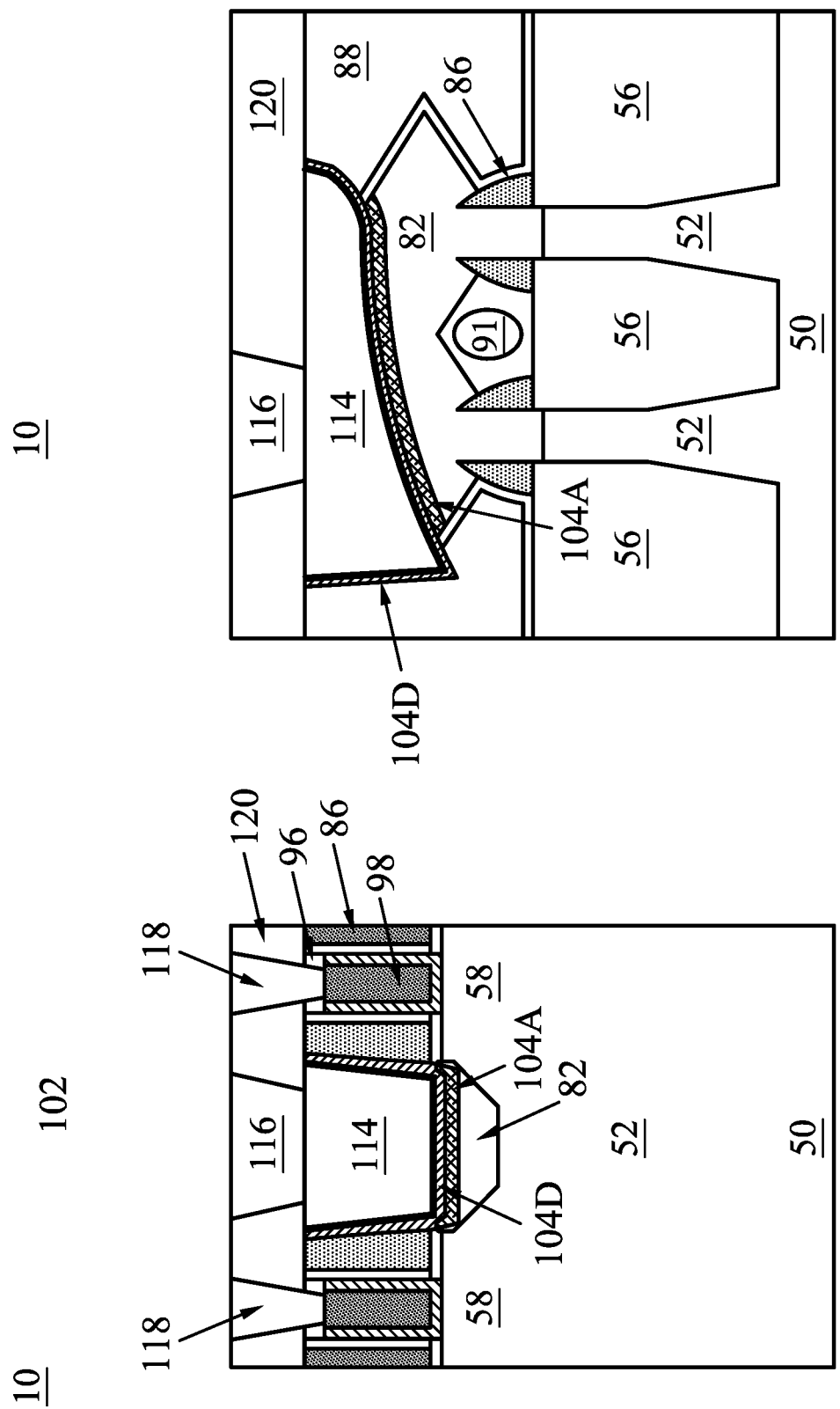

SILICIDE STRUCTURES IN TRANSISTORS AND METHODS OF FORMING

PRIORITY CLAIM AND CROSS-REFERENCE

This patent is a divisional of U.S. application Ser. No. 16/881,384, filed May 22, 2020, which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 22A, 22B, and 22C are cross-sectional views of intermediate stages in the manufacturing of FinFETs, in accordance with some embodiments.

DETAILED DESCRIPTION

Figure 1:
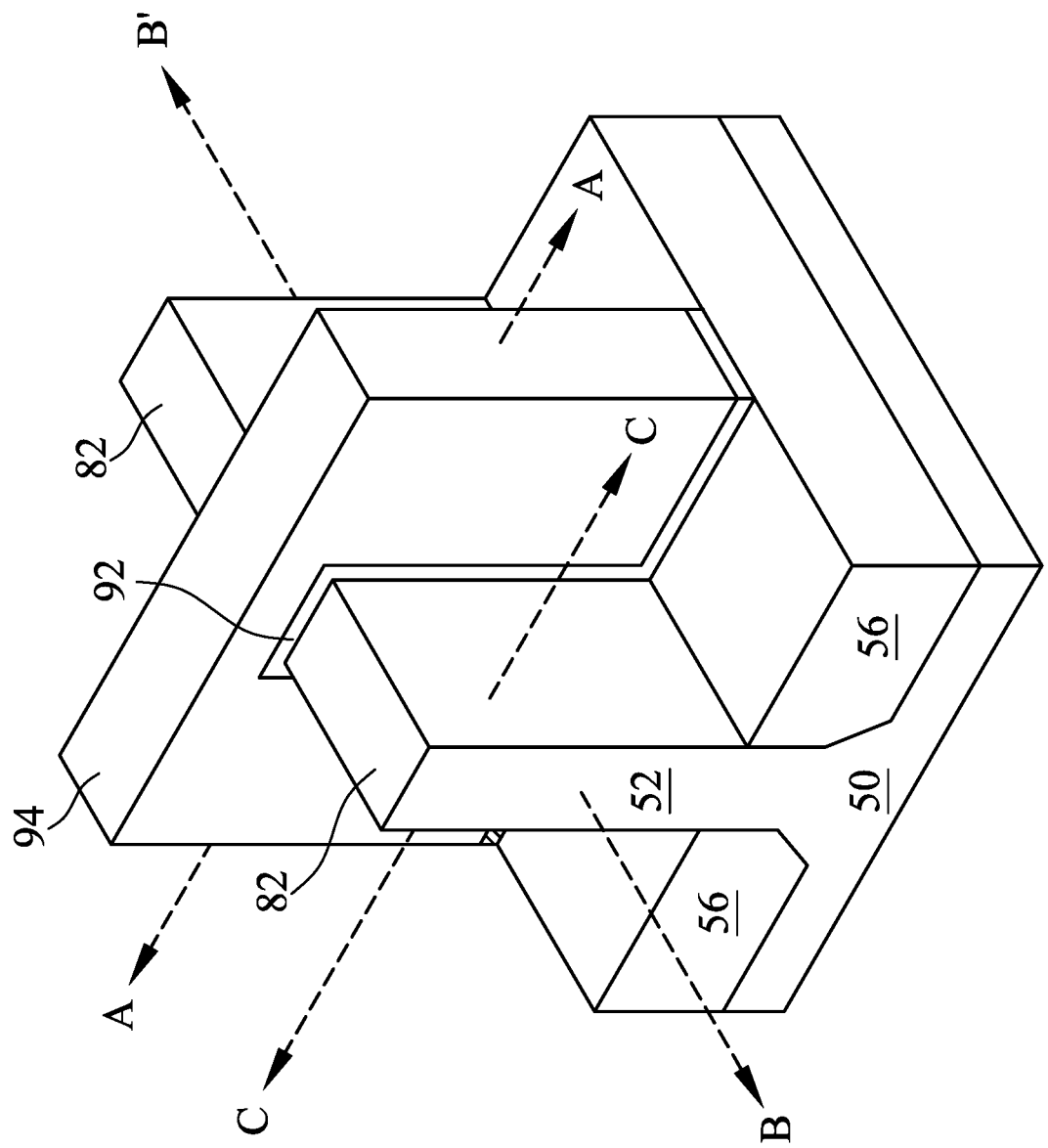
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a conformal silicide in a source/drain region. Compared to non-conformal silicides (e.g., formed using a physical vapor deposition (PVD) process), the conformal silicide may allow for reduced source/drain contact resistance ($R_{csd}$). For example, $R_{csd}$ reductions of about 0.2 kΩ to about 0.4 kΩ per fin of a finFET transistor has been observed by including conformal silicides in both NMOS and PMOS finFET transistors. The conformal silicide may be formed by depositing a metal (e.g., titanium, or the like) using a conformal deposition process, such as plasma enhanced chemical vapor deposition (PECVD), or the like. Due to the conformal deposition process, excess metal material overhang on sidewalls of source/drain contact openings can be controlled, eliminating a separate sidewall cleaning step to remove undesirable metal overhang. The metal may also be deposited at a sufficient temperature to intermix with a crystalline material of the source/drain region, which eliminates the need for a separate annealing step after deposition. Thus, embodiment methods may decrease manufacturing steps, which advantageously increases manufacturing efficiency and decreases cost.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 16B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, and 14A are illustrated along reference cross-section A-A illustrated in FIG. 1, and FIGS. 8B, 9B, 10B, 11B, 12B, 13B, 14B, 14C, 15A, 16A, 17A, 18A, 19A, 20A, 21A, and 22A are illustrated along a similar cross-section B-B illustrated in FIG. 1, except for multiple fins/FinFETs. FIGS. 10C, 10D, 15B, 16B, 17B, 18B, 19B, 20B, 21B, and 22B are illustrated along reference cross-section C-C illustrated in FIG. 1, except for multiple fins/FinFETs.

Figure 2:
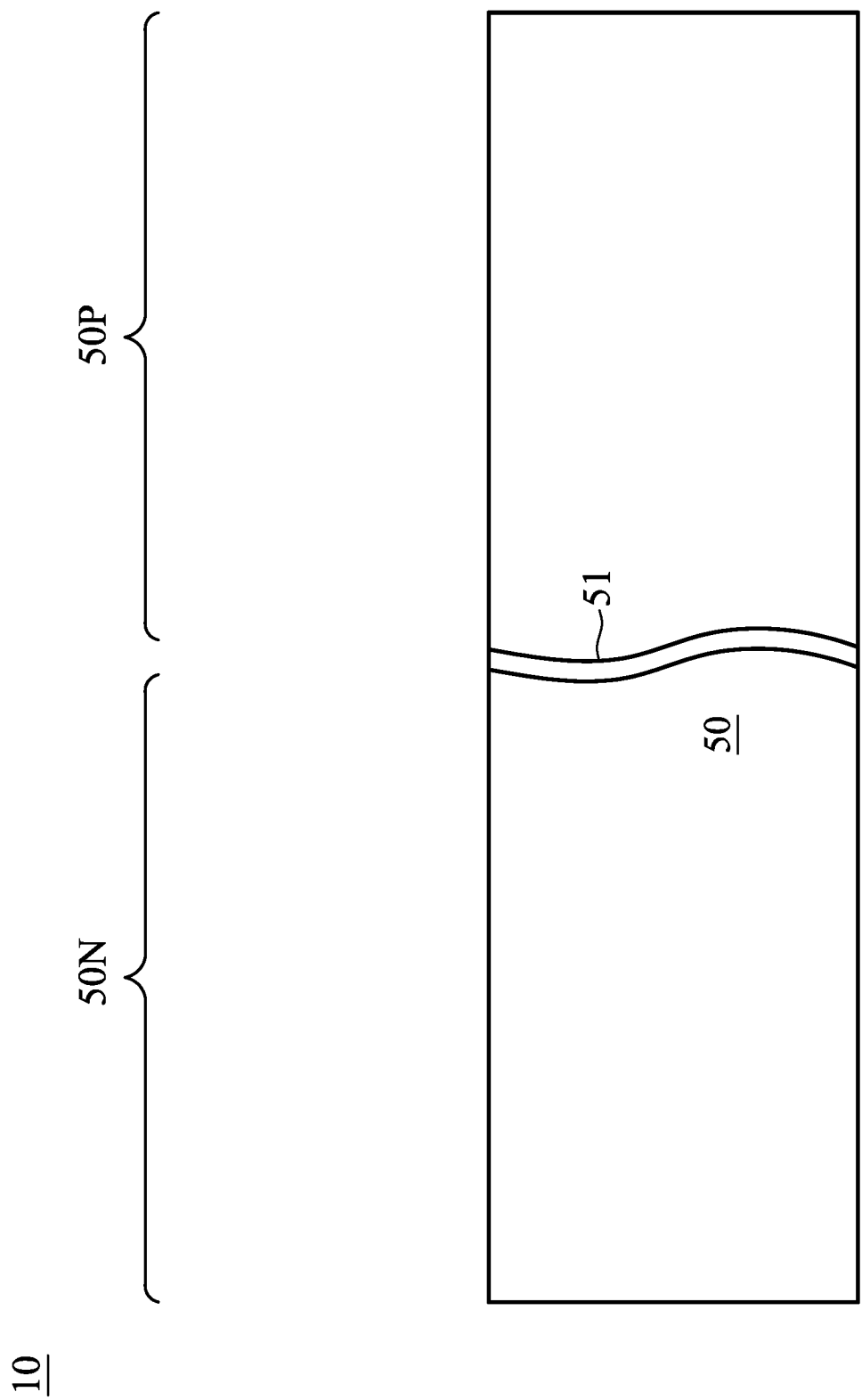

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 may be part of a wafer 10, such as a silicon wafer. For example, various structures for multiple dies may be formed together on the wafer 10. Subsequently, a singulation process may be applied to the wafer 10 to separate each die from other dies in the wafer 10.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
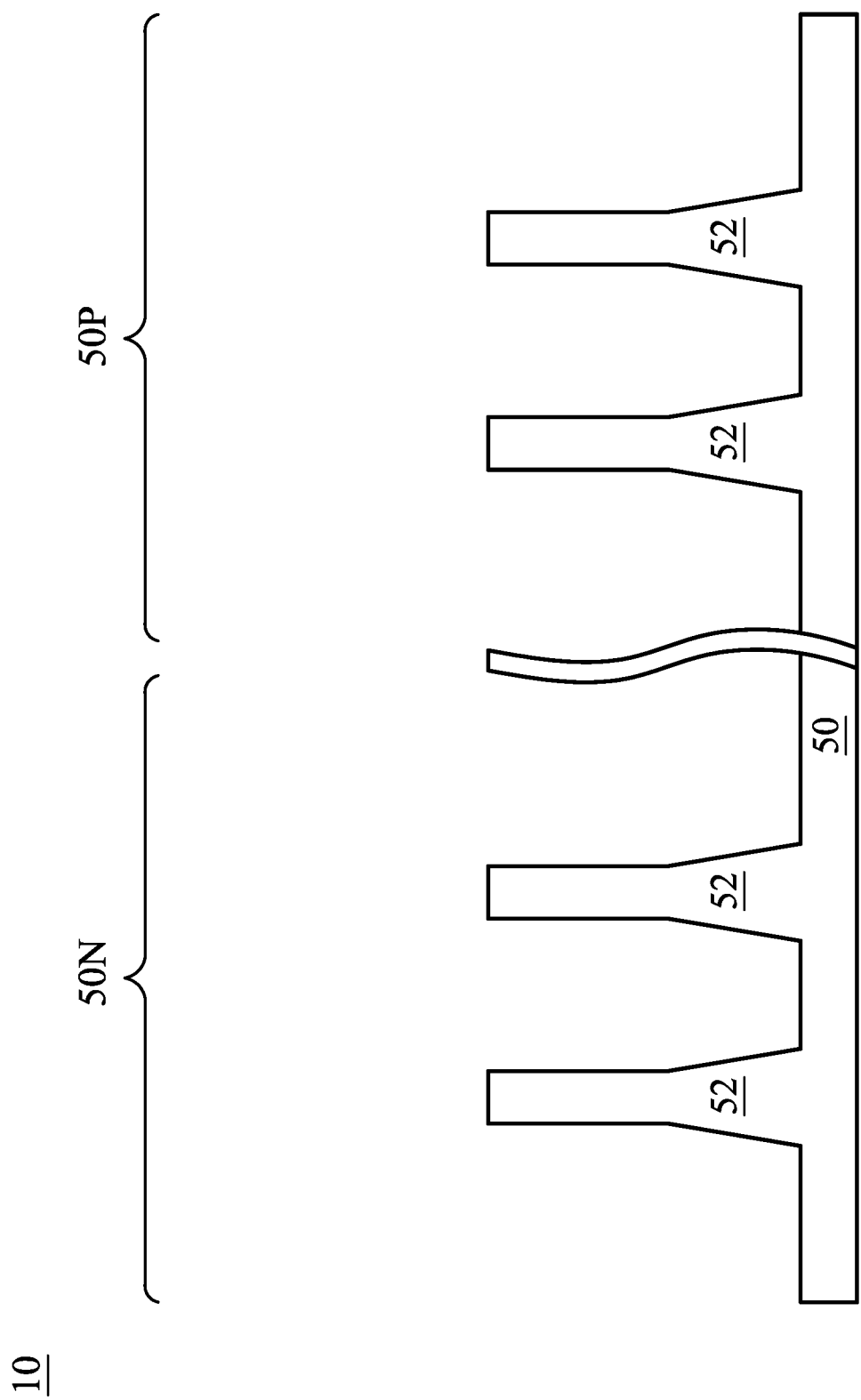

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
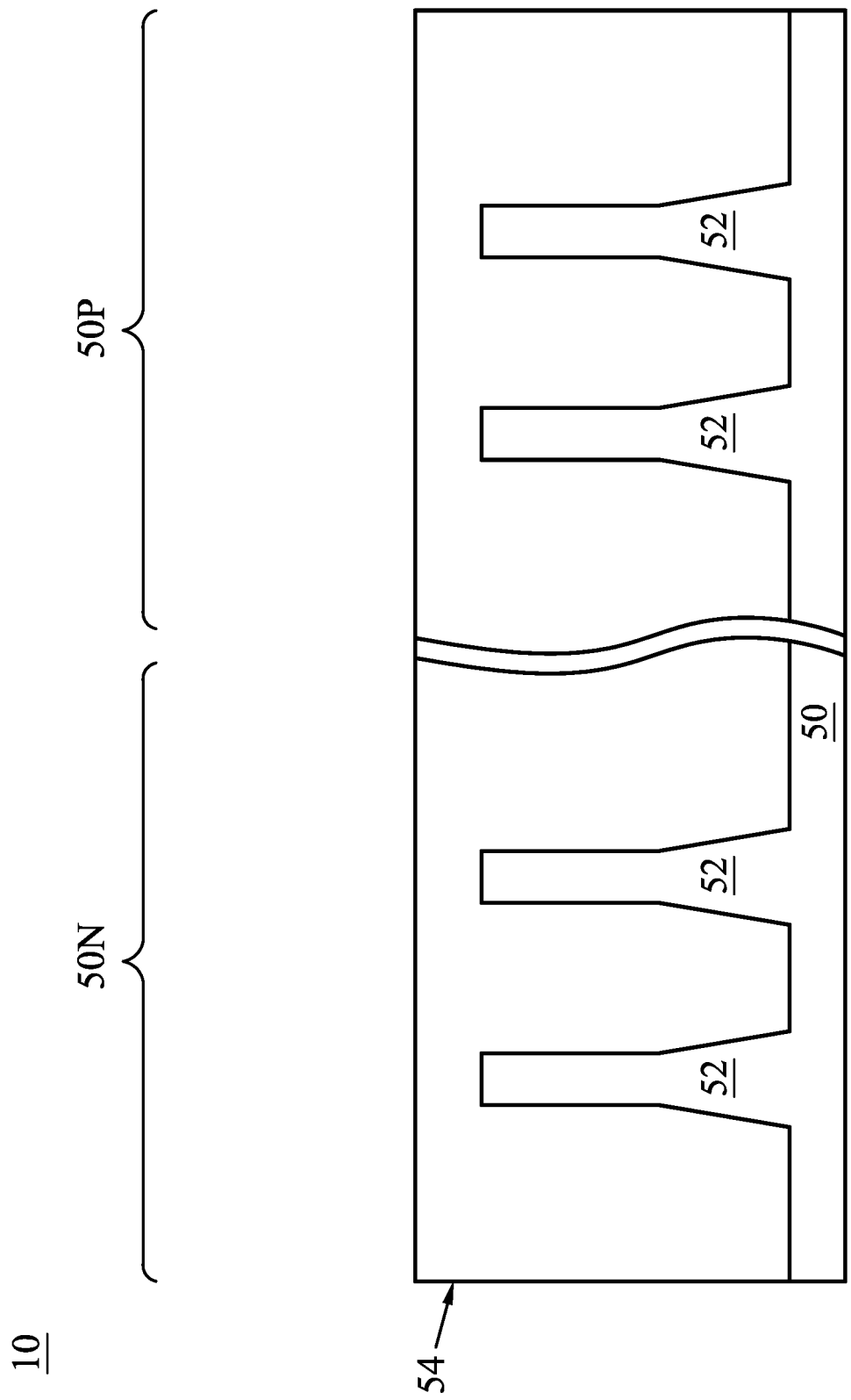

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
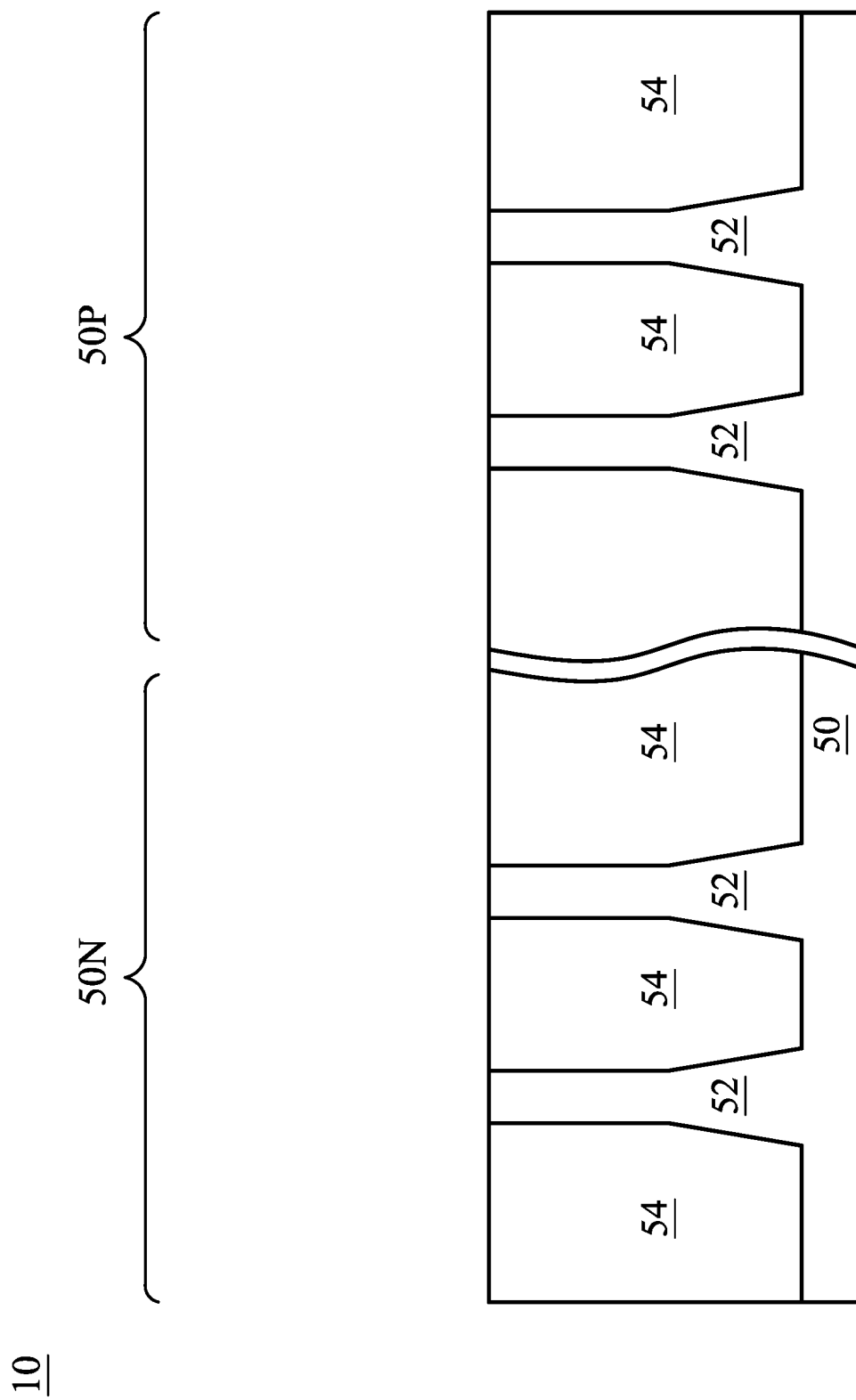

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
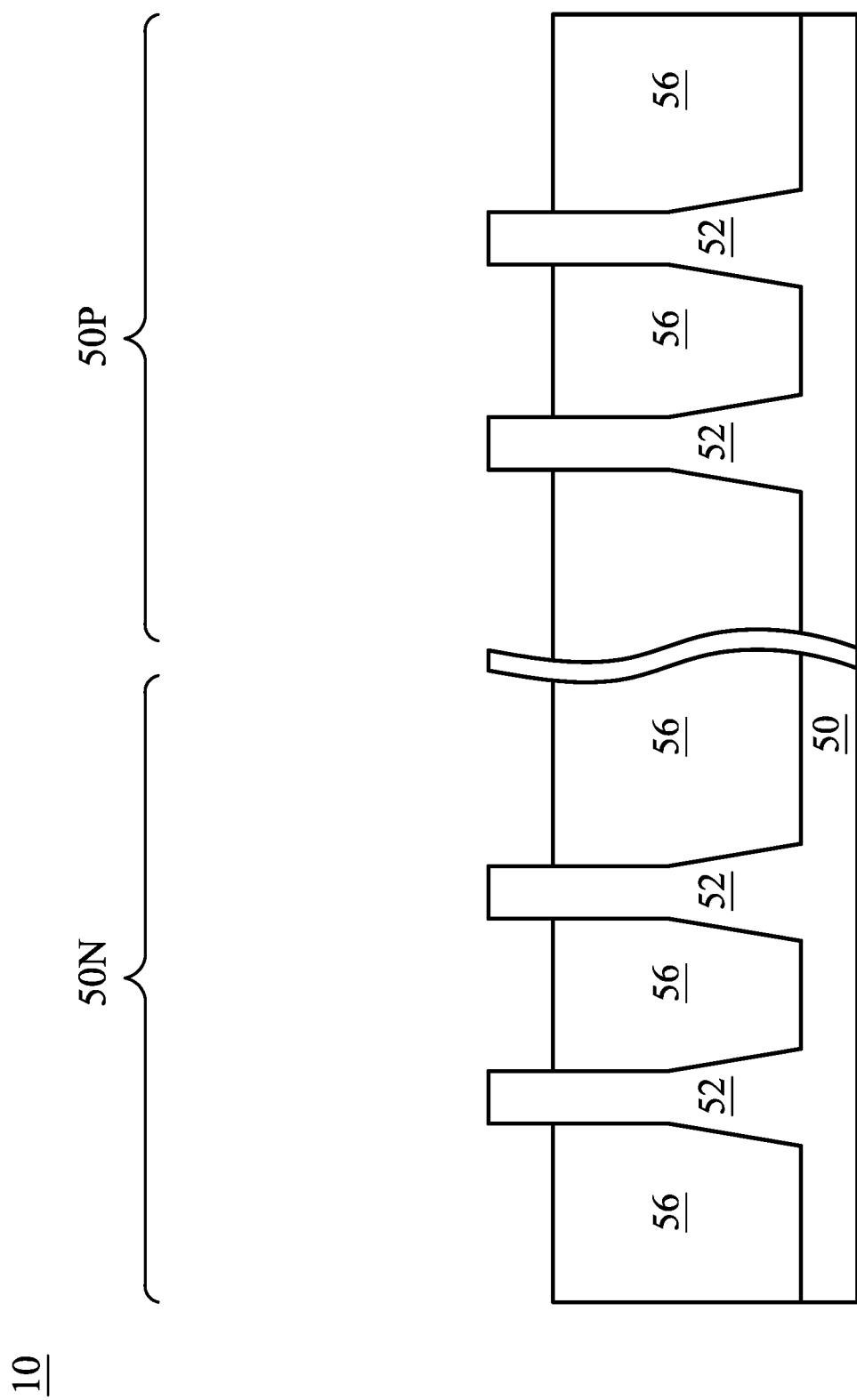

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
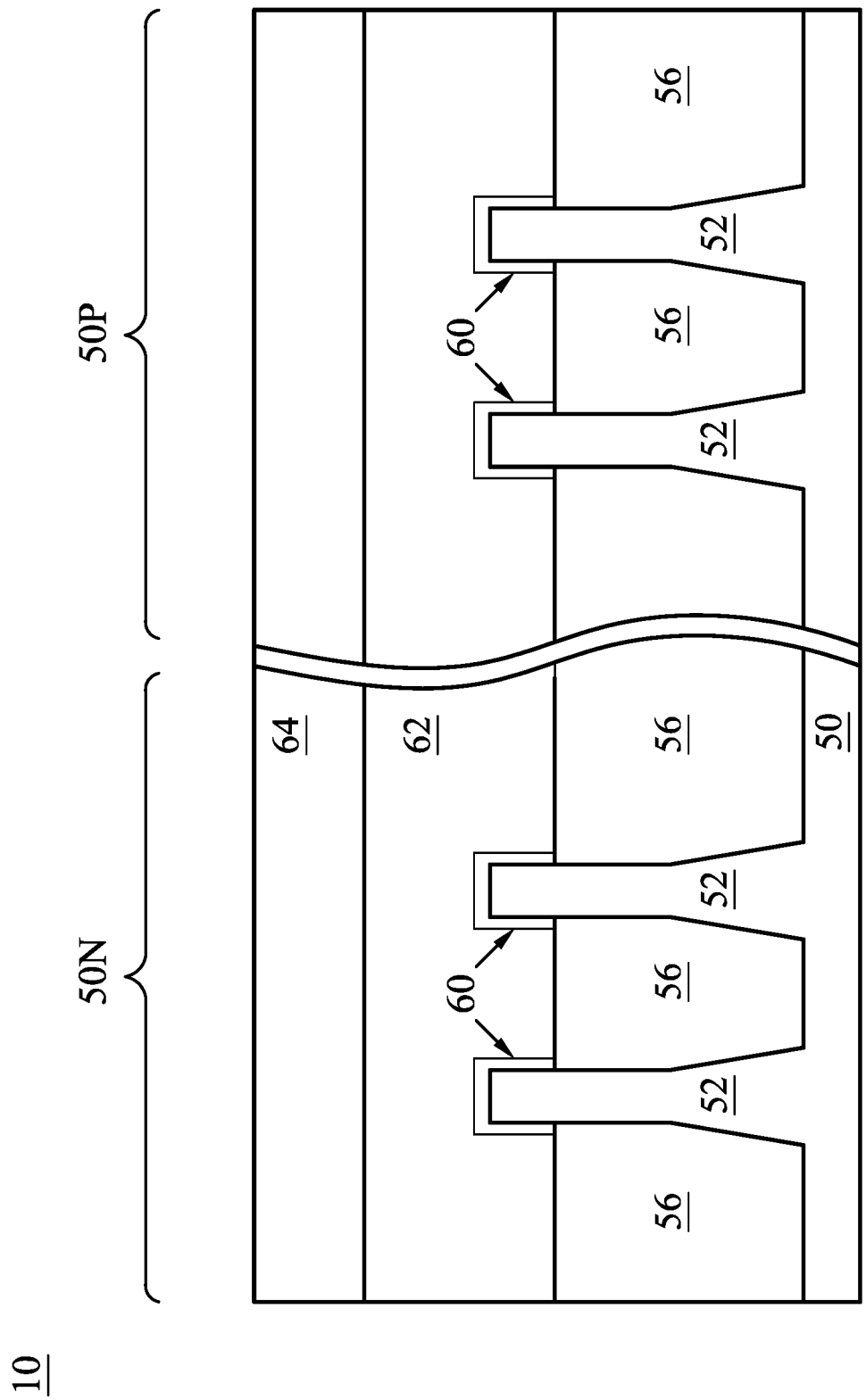

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 22B illustrate various additional steps in the manufacturing of embodiment devices. FIGS. 8A through 22B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
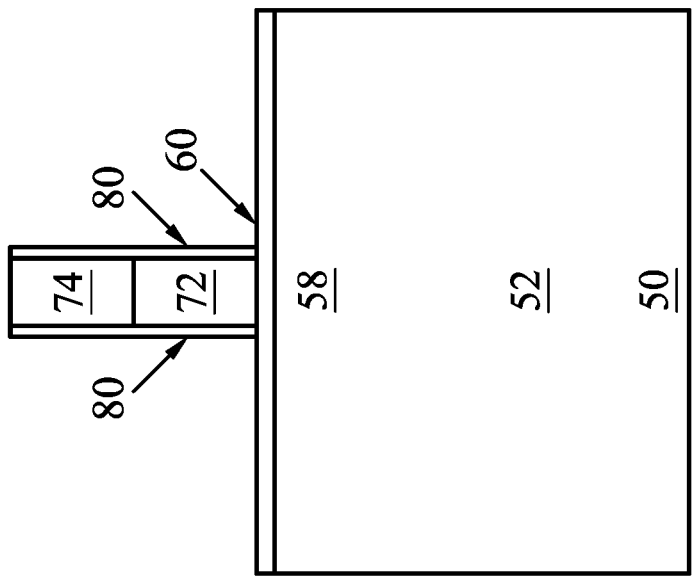
Figure 8A:
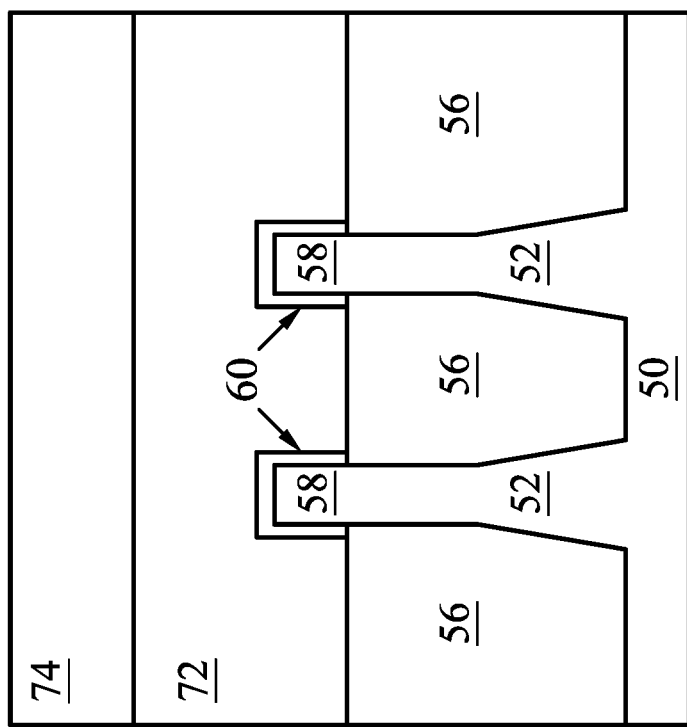

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
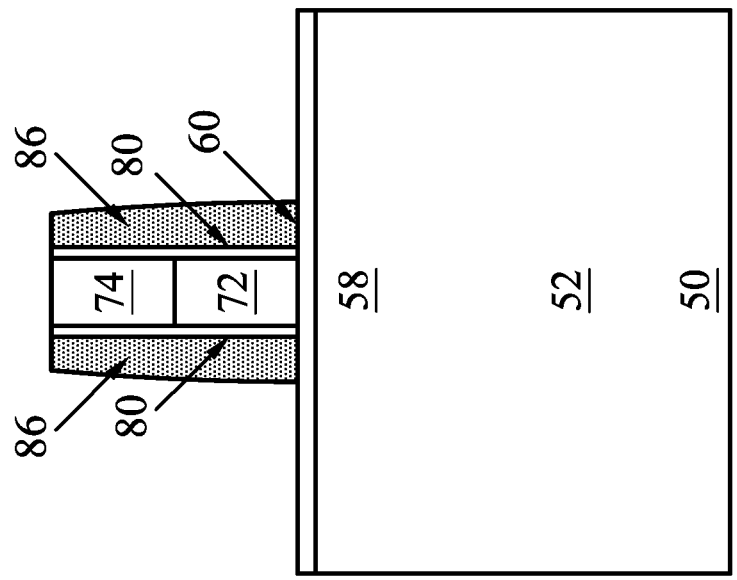
Figure 9A:
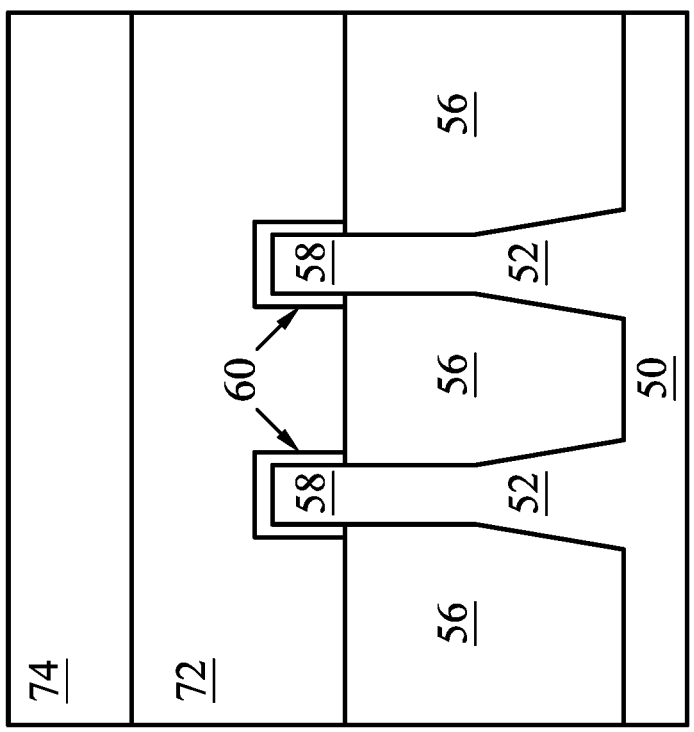

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
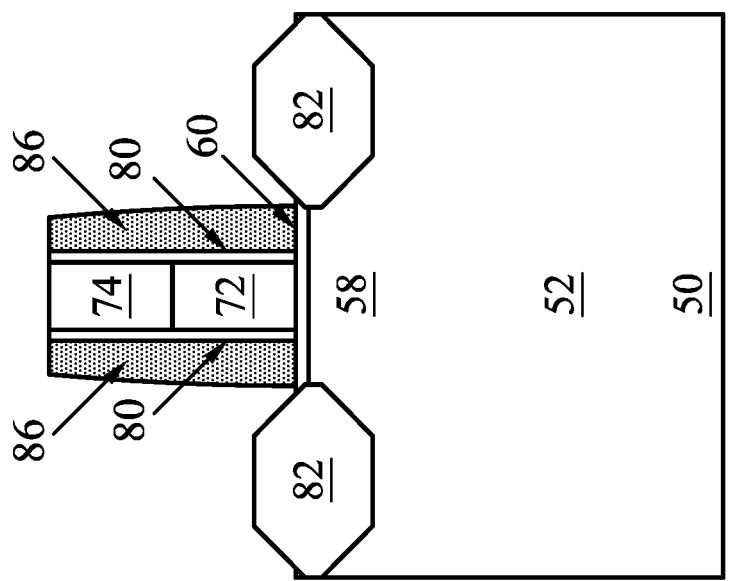
Figure 10A:
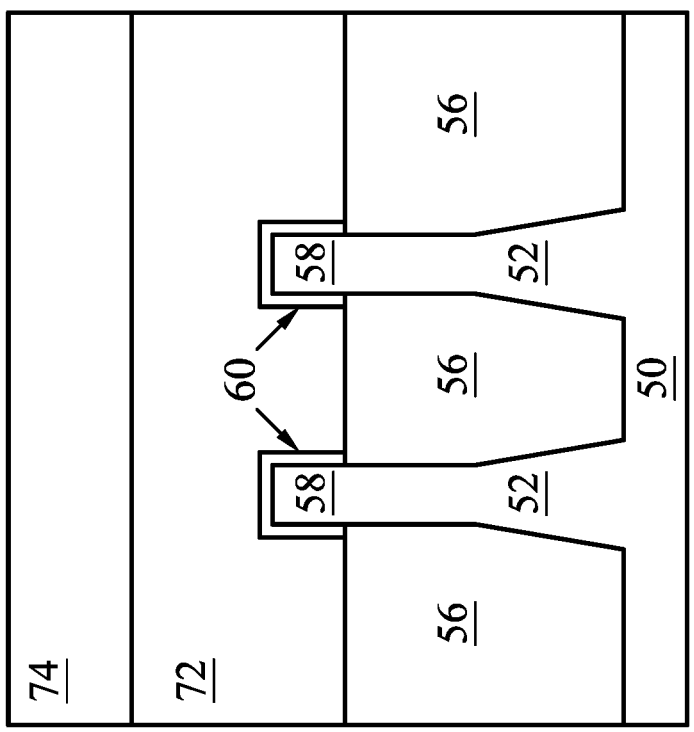

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 10C:
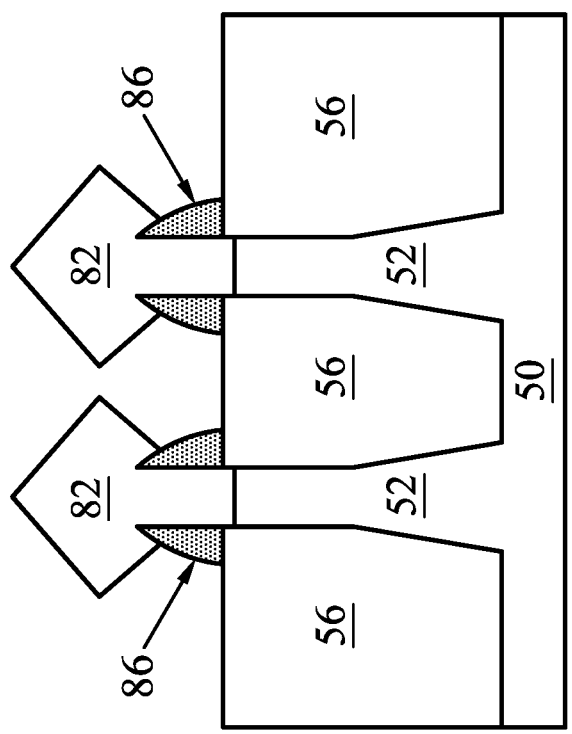
Figure 10D:
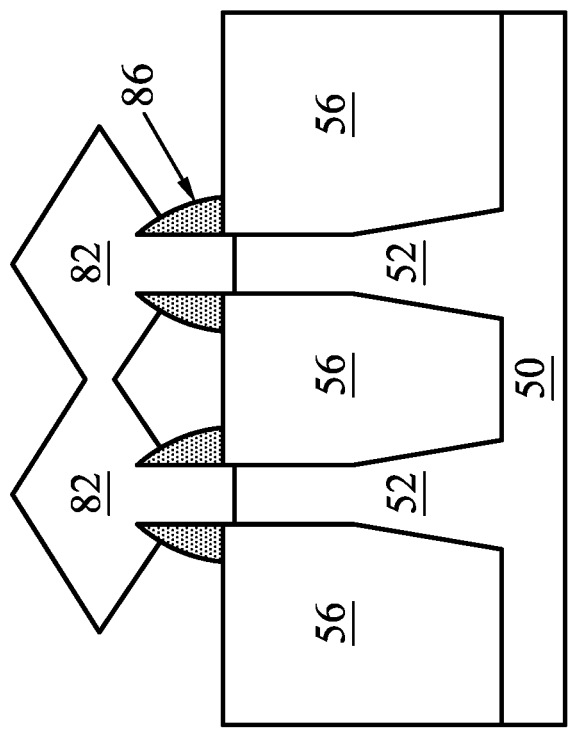

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
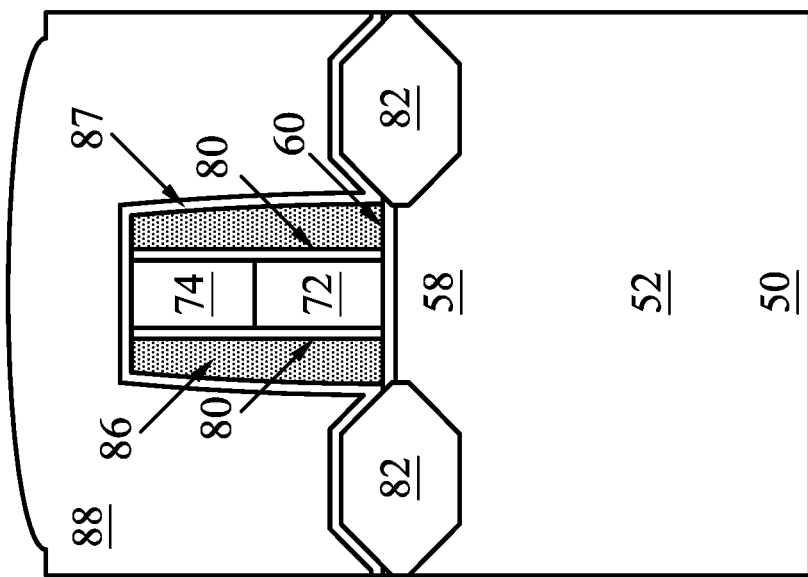
Figure 11A:
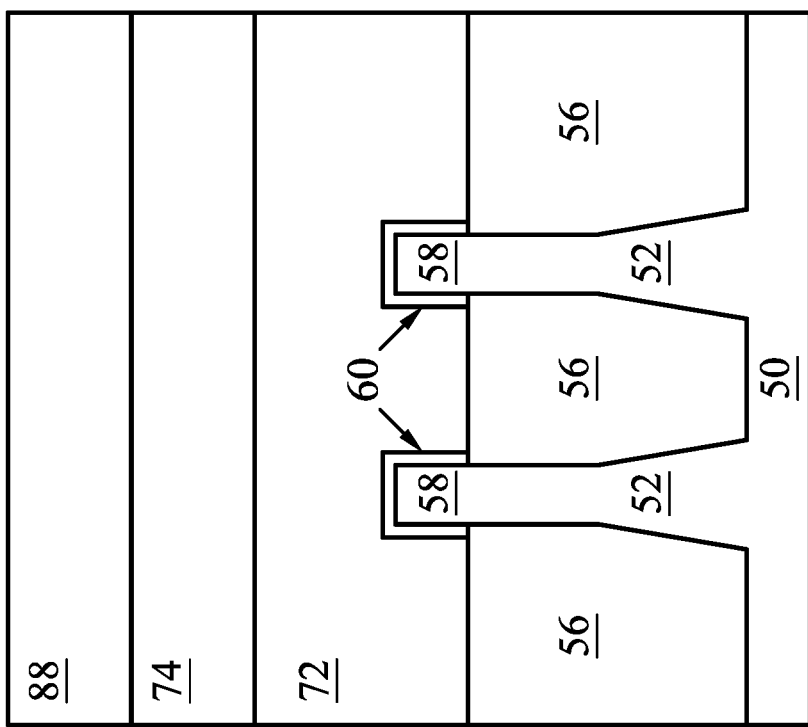

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 12B:
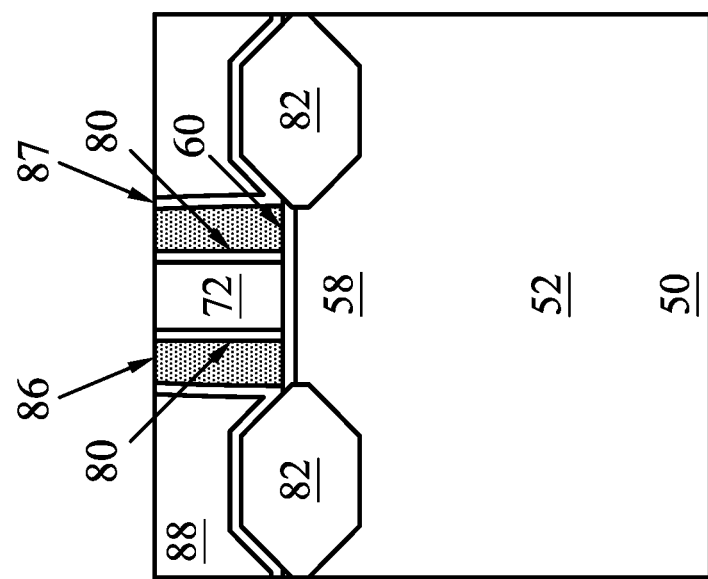
Figure 12A:
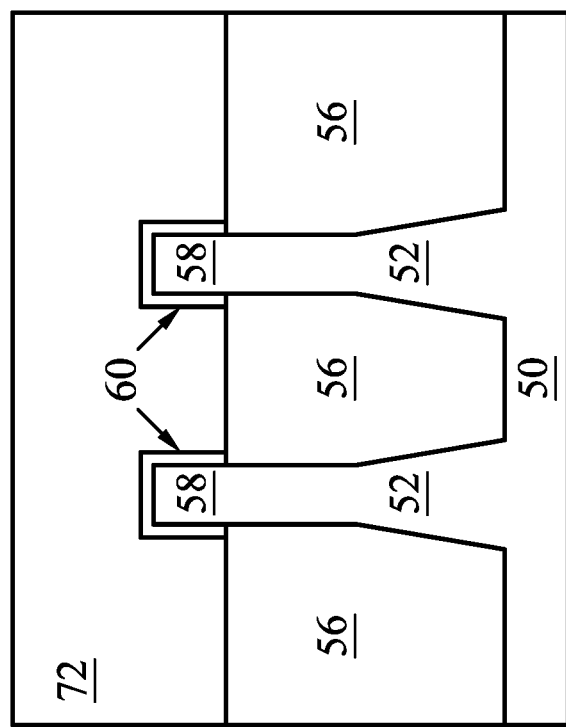

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
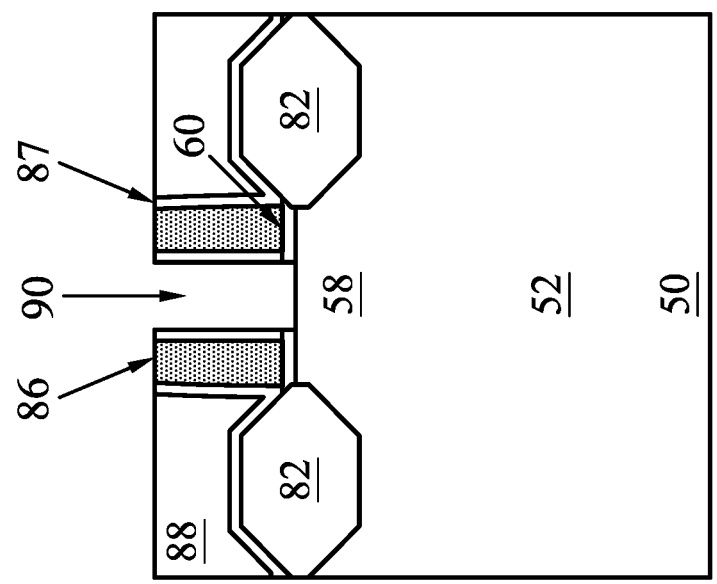
Figure 13A:
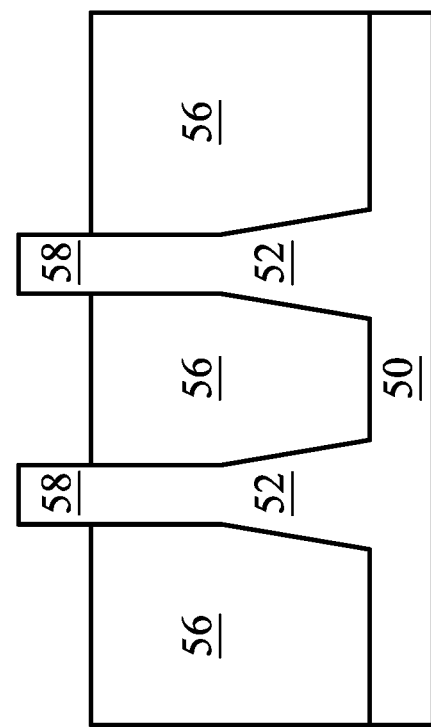

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14C:
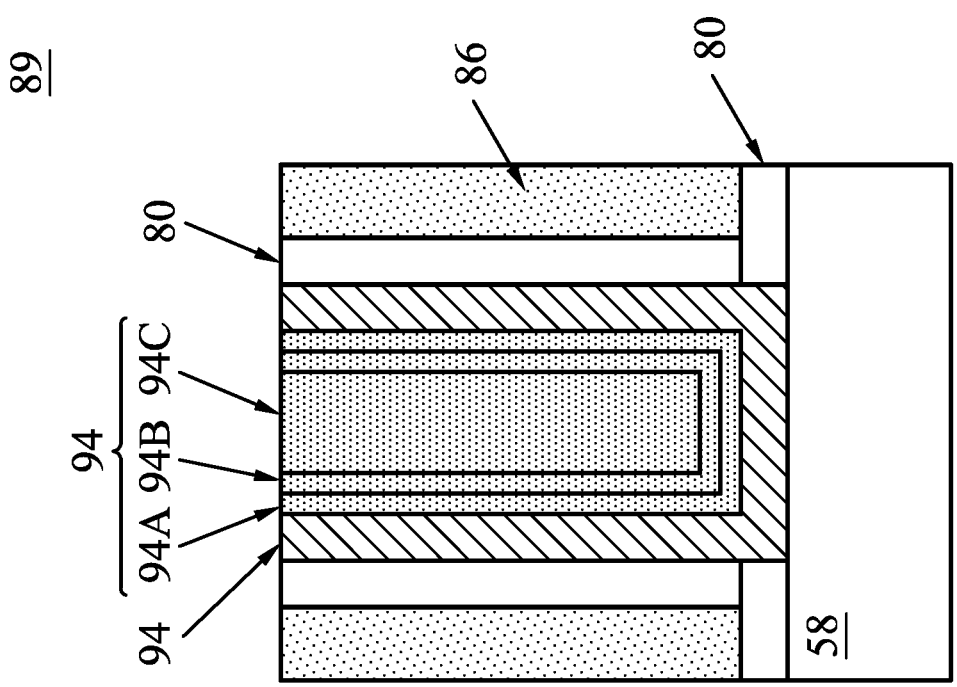

In FIGS. 14A and 14B, gate dielectric layers 92 and gate electrodes 94 are formed for replacement gates. FIG. 14C illustrates a detailed view of region 89 of FIG. 14B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack 98." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

FIGS. 15A through 22B illustrate various intermediate process steps for forming a conformal, source/drain silicide and a source/drain contact according to various embodiment. FIGS. 15A, 16A, 17A, 18A, 19A, 20A, 21A, and 22A illustrate a cross-section similar to a cross-section along line B-B of FIG. 1 except in an area between two adjacent gate stacks 98. FIGS. 15B, 16B, 17B, 18B, 19B, 20B, 21B, and 22B illustrate a cross-section similar to a cross-section along line C-C of FIG. 1. Although a merged source/drain similar to FIG. 10B configuration is illustrated, various embodiments can also be applied to separated source/drain regions similar to FIG. 10C (see e.g., FIG. 22C illustrating an embodiment source/drain contact 114 and conformal silicide 104 formed on an unmerged, epitaxial source/drain region 82). In such embodiments, a separate source/drain contact may be formed to contact each of the separate source/drain regions. Alternatively, a common source/drain contact may be formed to contact two or more of the separated source/drain regions.

Figure 15B:
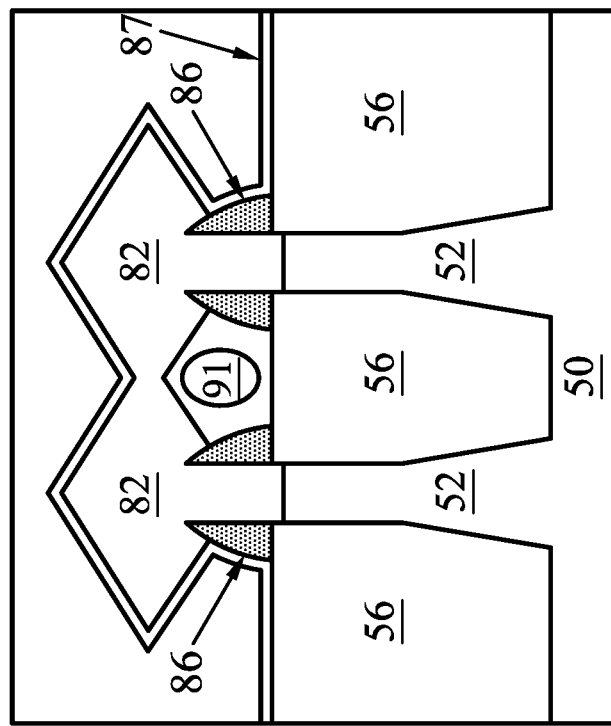
Figure 15A:
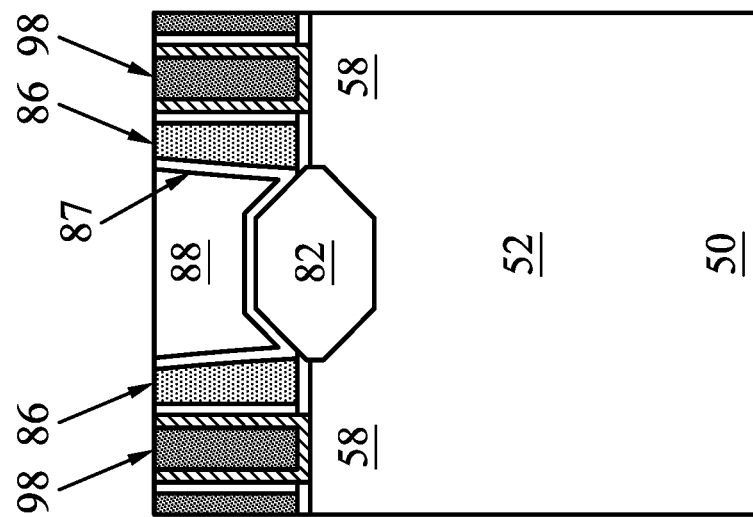

Referring to FIGS. 15A and 15B, two gate stacks 98 are separated by the first ILD 88 and the CESL 97, and an epitaxial source/drain region 82 is formed between the two gate stacks 98. In a merged source/drain configuration of FIG. 15B, a void 91 may be present in a region under the epitaxial source/drain regions 82 (e.g., in a region underlying a merging boundary of the epitaxial source/drain regions 82). The void 91 may be formed as a result of the deposition process used to form the first ILD 88. For example, the void may be formed by controlling precursor gas flow into the region under the merging boundary of the epitaxial source/drain regions 82. In alternative embodiments, the void may be omitted. In still alternative embodiments, the first ILD 88 may be completely omitted from under the merging boundary of the epitaxial source/drain region 82. For example, the void 91 may be extend continuously between adjacent gate spacers 86, and the void 91 may extend from the epitaxial source/drain region 82 to the STI 56.

In FIGS. 16A and 16B, openings 100 are formed to the source/drain epitaxial regions 82. The openings 100 may be formed using acceptable photolithography and etching techniques (e.g., wet and/or dry etching processes). The etching may be anisotropic. The openings 100 may be formed by etching the ILD 88 to expose the CESL 87. Then, portions of the CESL 87 in the openings 100 may also be removed. The etchants used to etch the ILD 88 and the CESL 87 may be the same or different. Forming the openings 100 may further include etching the epitaxial source/drain regions 82 such that the openings extend lower than a bottom of the gate stacks 98. By over etching the epitaxial source/drain regions 82, the subsequently formed source/drain contact (see FIGS. 22A and 22B) may be embedded into the epitaxial source/drain contacts 82 for a secure electrical connection.

Figure 17B:
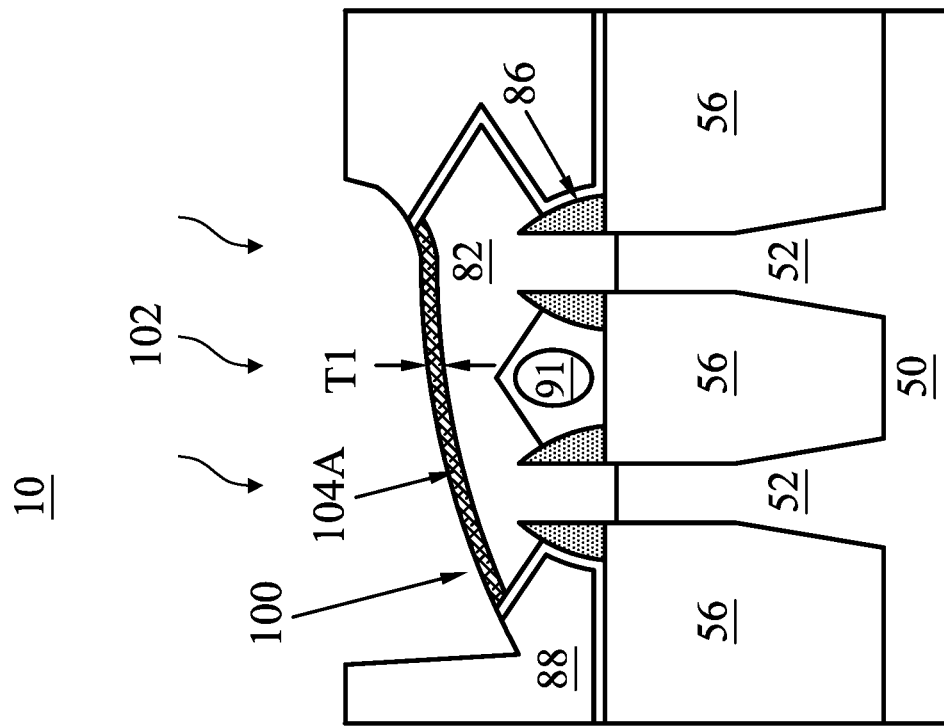
Figure 17A:
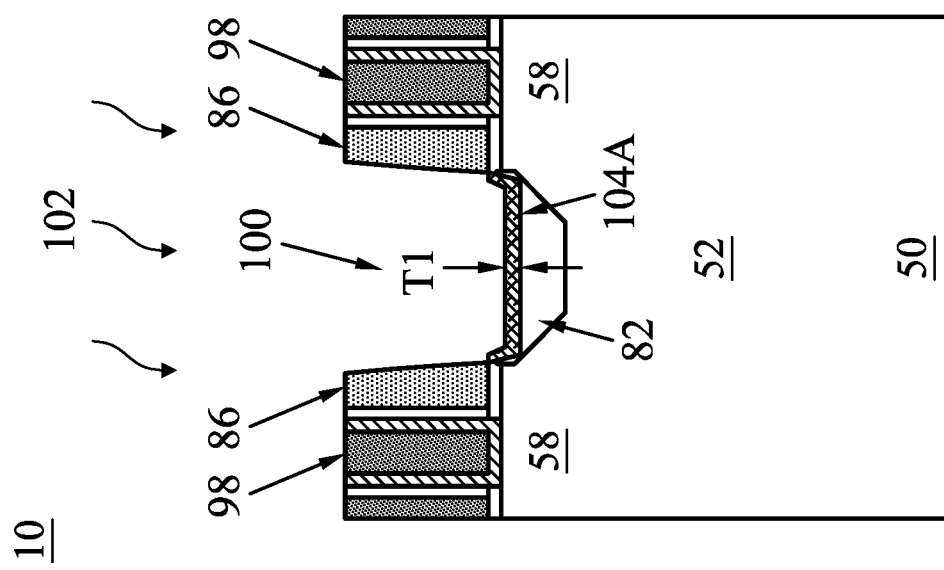
Figure 23:
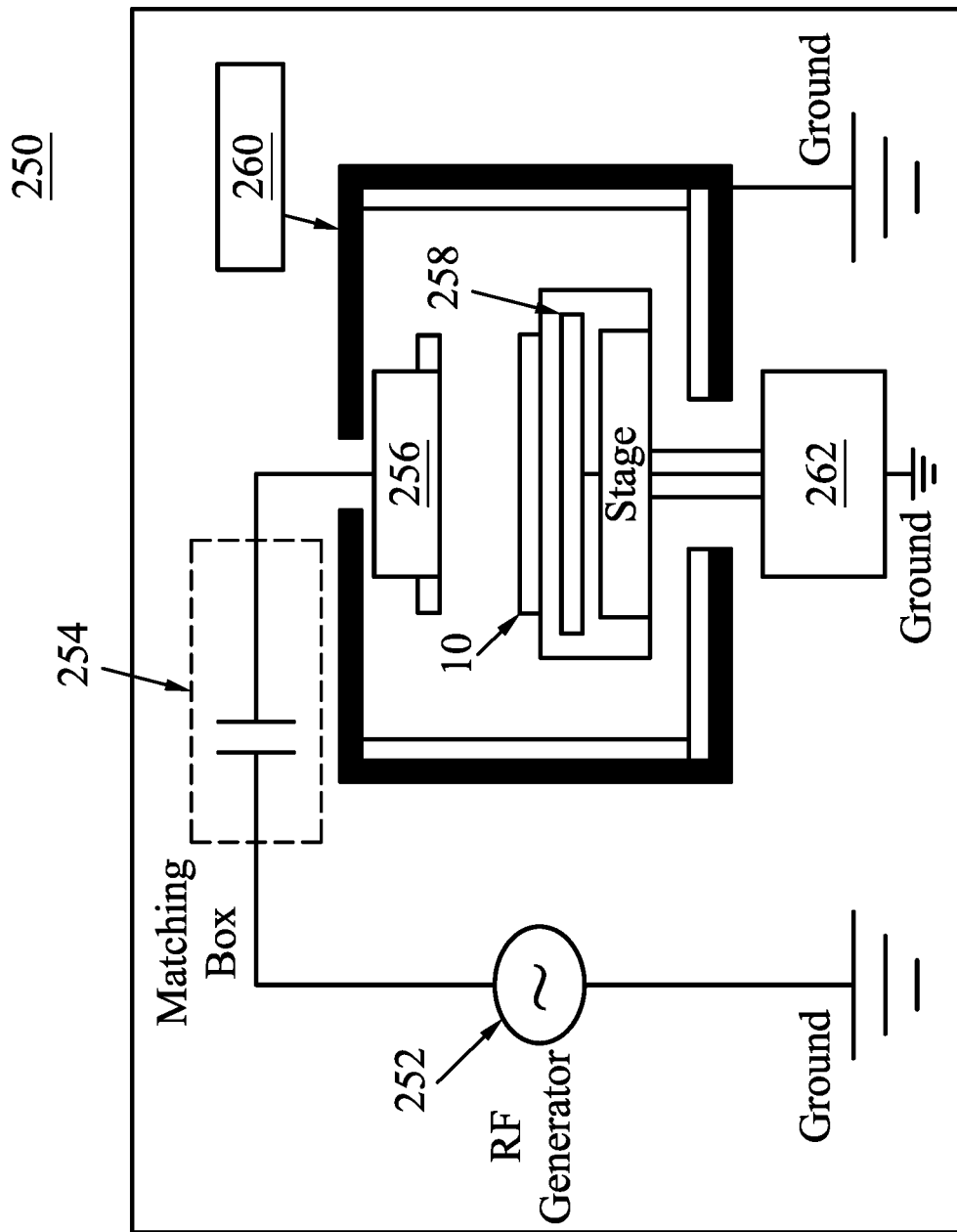
FIG. 23 illustrates a deposition chamber in accordance with some embodiments.

In FIGS. 17A and 17B, a first portion 104A of a silicide 104 (see FIGS. 19A and 19B) is formed on exposed areas of the epitaxial source/drain regions 82 using a conformal deposition process 102. The conformal deposition process 102 may be a PECVD process, for example, which may occur in a deposition chamber, such as deposition chamber 250 (see FIG. 23). Referring to FIG. 23, the deposition chamber 250 includes a radio-frequency (RF) generator 252 (e.g., connected to ground and a power supply), a RF controller 254, a shower head 256, a wafer stage 258, walls 260, and a controller 262. The shower 256 distributes precursor chemical(s) into the deposition chamber 250, and the RF generator 252 converts the precursor chemical(s) into plasma form as controlled by the RF controller 254. The controller 262 may be used to control/stabilize a current applied to the wafer 10. In some embodiments, the controller 262 may comprise an impedance heater for the wafer stage 258. The wafer 10 is placed on a wafer stage 258. In some embodiments, the wafer stage 258 may comprise an electrostatic chuck. The wafer stage 258 may be connected to a voltage source 262, which charges the wafer stage 258 and attracts plasma ions (e.g., the precursor chemicals charged by the RF generator 252) to the top surface of the wafer 10 during the deposition process. Walls 260 of the deposition chamber 250 may also be grounded. FIG. 23 illustrates an embodiment deposition chamber. However, other types of deposition chambers may be used as well.

Figure 17C:
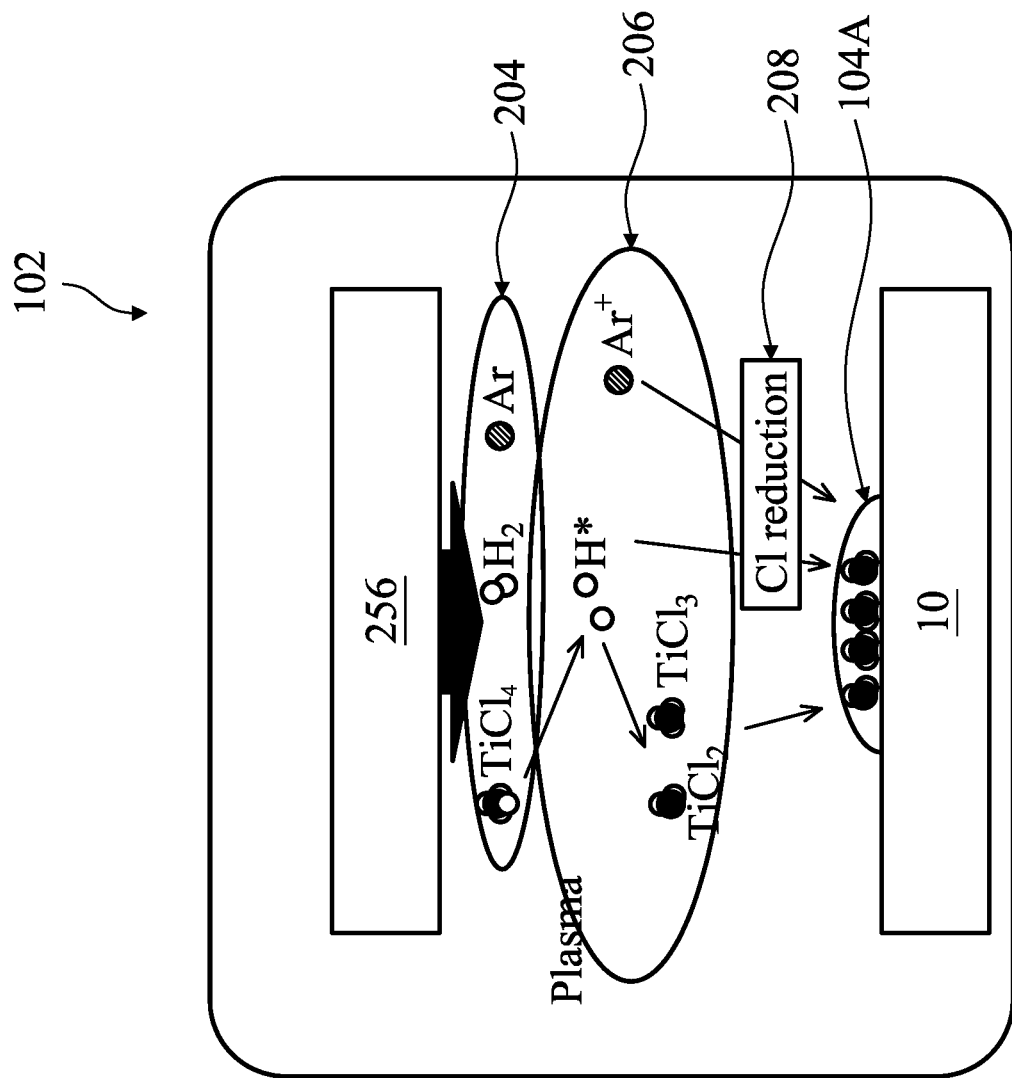
FIGS. 17C and 18C are schematic drawings of a deposition process in accordance with some embodiments.

FIG. 17C schematically illustrates the conformal deposition process 102. As illustrated by FIG. 17C, a shower head 256 distributes precursor chemicals 204 into a deposition chamber (e.g., deposition chamber 250 of FIG. 23). In embodiments where the silicide 104 is a titanium silicide, the precursor chemicals 204 may include titanium tetrachloride (TiCl$_4$), hydrogen (H$_2$), and argon (Ar). It has been observed that titanium is a desirable metal for silicide formation due to its lower Schottky barrier height (SBH) and improved silicon consumption compared to other metals (e.g., nickel). In other embodiments, a different metal (e.g., nickel, cobalt, or the like) may be deposited for silicidation of the epitaxial source/drain regions 82. In such embodiments, the precursor chemicals 204 may be adjusted accordingly.

The precursor chemicals 204 are excited and converted into plasma 206, e.g., using RF generator 252 (see FIG. 23). In embodiments where the silicide 104 is a titanium silicide, the precursor chemicals 204 (e.g., comprising TiCl$_4$, H$_2$, and Ar) may be primarily converted to titanium (III) chloride (TiCl$_3$), hydrogen ions (H*), and argon ions (Ar*+) although titanium (II) chloride (TiCl$_2$) and residue TiCl$_4$ may also be present. For example, plasma 206 may comprise a greater amount of TiCl$_3$ than TiCl$_2$ or TiCl$_4$, and the majority of titanium chloride in the plasma 206 is TiCl$_2$. The plasma 206 may further react at temperature, and as a result, the following chlorine reduction, reaction mechanism occurs to deposit a layer of titanium on the wafer 10 while generating hydrogen chloride (HCl) and argon as a byproduct. The byproducts (e.g., HCL and argon) may be purged from the plasma changer by a pump.

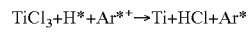

In various embodiments, the conformal deposition process 102 may be performed at a sufficiently high temperature to trigger the chemical reaction described above of the plasma 206. For example, the processing temperature during the conformal deposition process 102 is at least about 400° C. The relatively high processing temperature (e.g., at least about 400° C.) is also sufficiently high to cause the deposited, titanium layer to intermix with silicon molecules at exposed surfaces of the epitaxial source/drain regions 82, which forms a titanium silicide (e.g., first portion 104A) per the following reaction mechanism. Thus, a separate annealing step is not required to form the silicide, which increases manufacturing ease and reduces manufacturing costs.

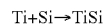

During the conformal deposition process 102, a power of the RF generator 252, a pressure, and/or gas flow may be controlled to be relatively low. Thus, the TiCl$_4$ may be primarily converted to TiCl$_3$ instead of titanium (II) chloride (TiCl$_2$). For example, during the conformal deposition process 102, a LF power in the range of about 80 W to about 500 W; a HF power in the range of about 100 W to about 600 W; a pressure of about 4 Torr to about 10 Torr; and a gas flow rate of about 5 standard cubic centimeters per minute (sccm) to about 100 sccm may be used. It has been observed that using TiCl$_3$ provides a deposition/etch type process, which is selective to the crystalline surfaces of the epitaxial source/drain regions 82. Thus, the first portion 104A of the silicide 104 may be selectively grown on the epitaxial source/drain region 82 without being grown significantly on other exposed surfaces of the wafer 10 (e.g., surfaces of the gate spacers 86, the gate stacks 98, or the first ILD 88).

Figure 24:
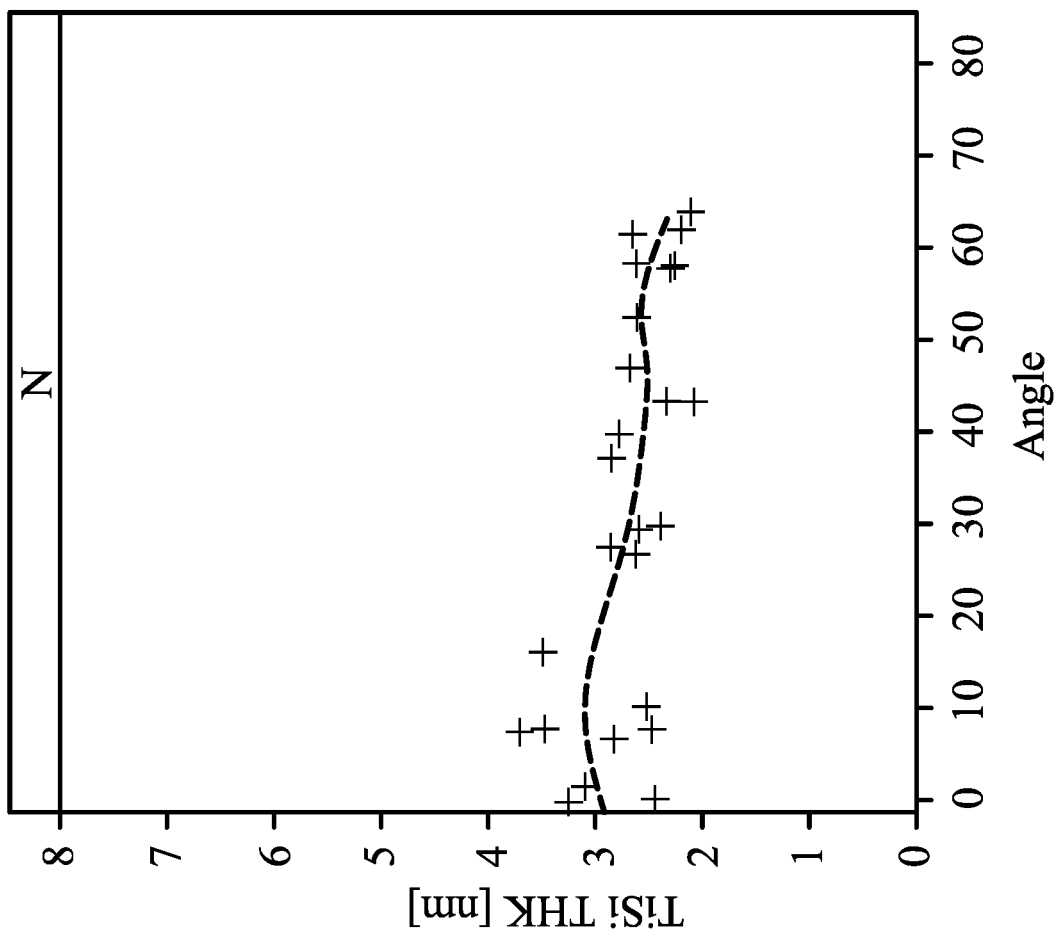
FIG. 24 illustrates thicknesses of a layer deposited in accordance with some embodiments.

Further, the conformal deposition process 102 may be self-limiting process such that the deposition process self-terminates once the first portion 104A grows to a thickness T1. The thickness T1 may be in a range of about 2 nm to about 4 nm in some embodiments. The first portion 104A resulting from the conformal deposition process 102 may be substantially conformal. For example, the thickness T1 across the first portion 104A is substantially uniform regardless of an underlying angle of a surface of the epitaxial source/drain region 82 on which the first portion 104A is deposited. For example, FIG. 24 illustrates experimental data charting thickness of a titanium silicide layer formed using embodiment deposition methods. The x-axis corresponds to angle of the underlying surface and the y-axis corresponds to a thickness of the deposited, titanium silicide. As illustrated by root mean square (RMS) line 270 of the experimental data, the thickness of the titanium silicide formed using embodiment methods is relatively uniform regardless of the angle of the underlying surface.

Referring back to FIG. 17C, in some embodiments, the thickness T1 ranges from about 1.71 nm (e.g., at a thinnest point) to about 3.69 nm (e.g., at a thickest point). Due to process limitations, there may still be variance between a minimum thickness of the first portion 104A and a maximum thickness of the first portion 104A. However, the first portion 104A may be conformal. For example, a ratio of a minimum thickness of the first portion 104A to a maximum thickness of the first portion 104A may be in a range of about 3.5:1 to about 5:1. It has been observed that by forming a silicide with thickness variations in the above range, source/drain contact resistance can be reduced as a result of the improved coverage of the silicide on the epitaxial source/drain regions 82. The improved coverage of the silicide is further not dependent on the underlying angle of the source/drain region's surface on which the silicide is formed.

Figure 18C:
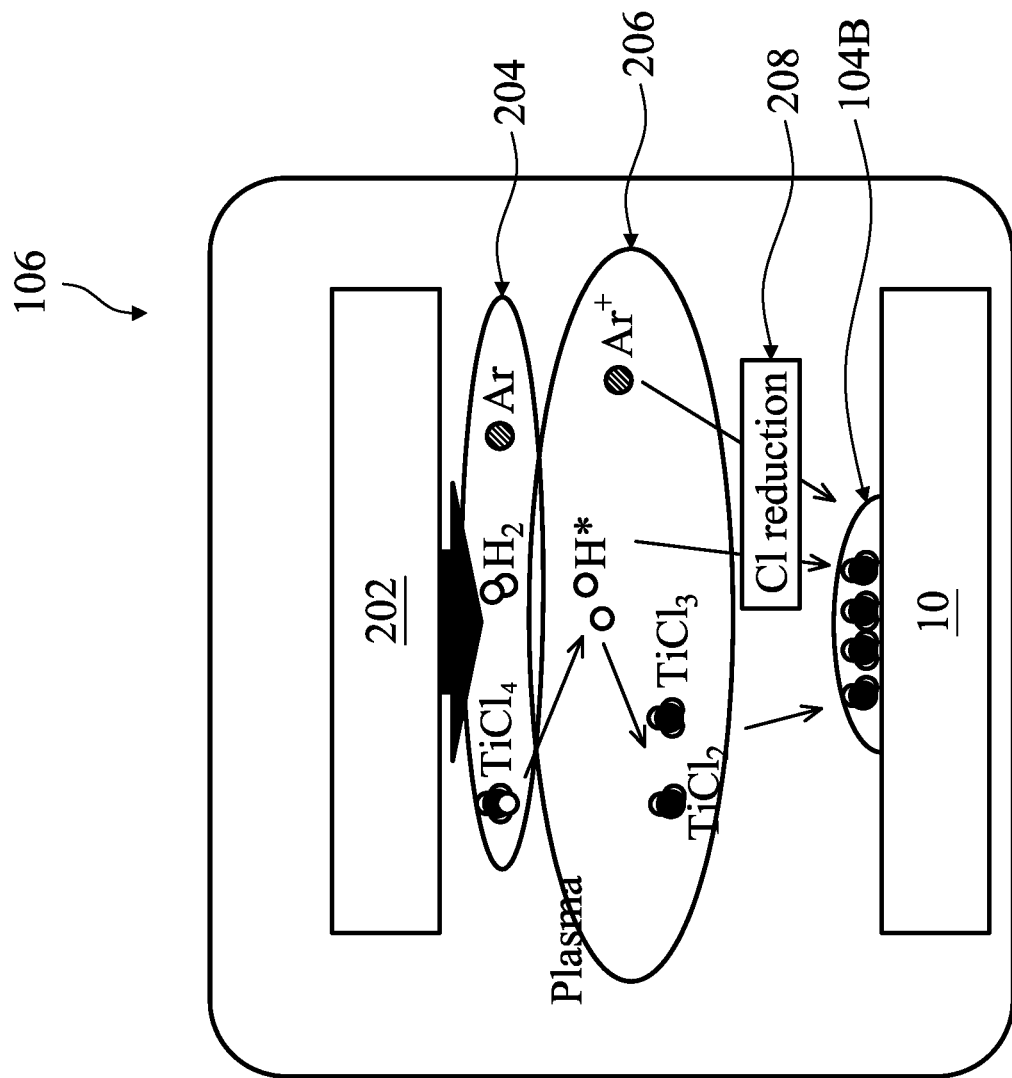

Because the conformal deposition process 102 is a self-limiting process, a second deposition process may be performed to increase a thickness of the silicide and further reduce source/drain contact resistance as illustrated by FIGS. 18A-18C. FIGS. 18A and 18B illustrate cross-sectional views of applying a second conformal deposition process 106 on the wafer 10 to form a second portion 104B of the silicide 104 (see FIGS. 19A and 19B). The second portion 104B is formed on the first portion 104A. The conformal deposition process 106 may be performed in situ (e.g., in a same deposition chamber) as the conformal deposition process 102.

FIG. 18C schematically illustrates the conformal deposition process 106. As illustrated by FIG. 18C, the shower head 256 continues to distribute the precursor chemicals 204 into a deposition chamber (e.g., deposition chamber 250 of FIG. 23). The precursor chemicals 204 may be the same as the precursor chemicals used during the conformal deposition process 102.

The precursor chemicals 204 are excited and converted into plasma 208, e.g., using RF generator 252 (see FIG. 23). In embodiments where the silicide 104 is a titanium silicide, the precursor chemicals 204 (e.g., comprising $TiCl_4$, $H_2$, and Ar) may be primarily converted to titanium (II) chloride ($TiCl_2$), hydrogen ions ($H^*$), and argon ions ($Ar^{*+}$) although $TiCl_3$ and residue $TiCl_4$ may also be present. For example, plasma 208 may comprise a greater amount of $TiCl_2$ than $TiCl_3$ or $TiCl_4$, and the majority of titanium chloride in the plasma 208 is $TiCl_2$. The plasma 208 may further react at temperature, resulting in the following, chlorine reduction, reaction mechanism, which deposits a layer of titanium on exposed surfaces of the wafer 10 while generating hydrogen chloride (HCl) as a byproduct.

In various embodiments, the conformal deposition process 106 may be performed at a sufficiently high temperature to trigger the chemical reaction of the plasma 206. For example, the processing temperature during the conformal deposition process 106 is at least about 400° C.

During the conformal deposition process 106, a power of the RF generator 252, a pressure, and/or gas flow may be increased compared to conformal deposition process 102. Thus, the $TiCl_4$ may be primarily converted to $TiCl_2$ instead of $TiCl_3$. For example, during the conformal deposition process 106, a LF power in the range of about 80 W to about 500 W; a HF power in the range of about 700 W to about 1500 W; a pressure of about 1 Torr to about 3 Torr; and a gas flow rate of about 5 sccm to about 100 sccm may be used. It has been observed that by using $TiCl_2$ as a reactant, the conformal deposition process 106 is not selective to the crystalline surfaces of the epitaxial source/drain regions 82. Thus, titanium may be deposited on all exposed surfaces of the wafer 10, including surfaces of the gate spacers 86, the gate stack 98, and the first ILD 88.

The relatively high processing temperature (e.g., at least about 400° C.) of the conformal deposition process 106 is also sufficiently high to cause the titanium layer to continue to intermix with silicon molecules at exposed surfaces of the epitaxial source/drain regions 82 and the first portion 104A, which creates a titanium silicide per the following reaction mechanism. Thus, a separate annealing step is not required to form the silicide 104, which increases manufacturing ease and reduces manufacturing costs. For example, no additional annealing step is performed between the conformal deposition process 106 and forming the source/drain contact 114 (see FIG. 22A-22C).

Further, the chlorine-comprising byproduct of the conformal deposition processes 102 and/or 106 may react with a material of the silicon nitride of the gate spacers and break bonds between silicon molecules and nitrogen molecules. As a result, the titanium layer on the gate spacers 86 may also intermix with silicon molecules to form a titanium silicide on the gate spacers 86 as well. Further, a metal layer 104C contacting the ILD 88 may react with the silicon oxide material of the ILD 88 to form a titanium oxide layer. Accordingly, portions of the metal layer 104C contacting the ILD 88 may be converted into titanium oxide rather than a titanium silicide.

The conformal deposition process 106 may be timed such that the deposition process terminates once the second portion 104B grows to a desired thickness T2. The thickness T2 may be less than the thickness T1 of the first portion 104A. For example, the thickness T2 may be in a range of about 1 nm to about 2 nm in some embodiments. The second portion 104B may be substantially conformal. For example, the thickness T2 across the second portion 104B is substantially uniform regardless of an underlying angle of a surface on which the second portion 104B is grown. Due to process limitations, there may still be variance between a minimum thickness of the second portion 104B and a maximum thickness of the second portion 104B. However, the second portion 104B may be conformal. For example, a ratio of a minimum thickness of the second portion 104B to a maximum thickness of the second portion 104B may be in a range of about 1:1 to about 1.5:1. It has been observed that by forming a silicide with thickness variations in the above range, source/drain contact resistance can be reduced as a result of the improved coverage of the silicide that is not dependent on the underlying angle of the source/drain region's surface on which the silicide is formed. Further by forming only a thin, conformal silicide layer on sidewalls of the opening 100, excess overhang on the sidewalls of the opening 100 can be avoided. In various embodiments, a mouth of the opening 100 remains relatively wide even after the second portion 104B is deposited. Thus, the silicide layer (e.g., second portion 104B) does not need to be removed from sidewalls of the opening 100 prior to source/drain contact formation, which advantageously increases manufacturing ease and reduces manufacturing cost.

After either or both of the conformal deposition processes 102 and 106, a purging step may be performed to remove a byproduct from the deposition chamber. For example, when the silicide 104 is a titanium silicide, a chlorine-comprising byproduct is created. Excess levels of chlorine in the silicide may cause deleterious effects such as increased source/drain contact resistance. Thus, a hydrogen gas may be pumped into the deposition chamber to remove the byproduct from the chamber and from surfaces of the wafer 10. In some embodiments, trace levels of chlorine molecules may remain within the first portion 104A and/or the second portion 104B after purging. For example, a level of chlorine of less than about 0.5 at. % may remain in the first portion 104A and/or the second portion 104B of the silicide. However, it has been observed that levels of chlorine in this range is insufficient to increase source/drain contact resistance in the completed device.

FIGS. 19A and 19B illustrate a passivation treatment 108 on the wafer 10. In some embodiments, the passivation treatment 108 may be performed in-situ (e.g., in the same process chamber) with the conformal deposition process 102 and 106. In some embodiments, passivation treatment includes introducing a gas mixture comprising ammonia and nitrogen into the deposition chamber. The ammonia and nitrogen are then converted to a plasma (e.g., using RF generator 252, see FIG. 23) to provide nitrogen ions. The nitrogen ions reacts with exposed surfaces of the second portion 104B to form a nitride portion 104D. The combination of the nitride portion 104D and the first portion 104A is a silicide 104 for the epitaxial source/drain regions 82. In embodiments where the silicide 104 is a titanium silicide, the nitride portion 104D may be a titanium silicon nitride (TSN) layer on the epitaxial source/drain regions 82 and the gate spacers 86, and the nitride portion 104D may be a titanium oxynitride layer on the ILD 88. The nitride portion 104D may have the thickness T2 of, for example, in a range of about 1 nm to about 2 nm. The passivation treatment 108 may be performed to prevent oxidation of the silicide 104 in subsequent processing steps. It has been observed that by forming a nitride layer in the above range, oxidation may be advantageously prevented without significantly increasing contact resistance.

Due to process limitations, there may still be variance between a minimum thickness of the nitride portion 104D and a maximum thickness of the nitride portion 104D. However, the nitride portion 104D may be conformal. For example, a ratio of a minimum thickness of the nitride portion 104D to a maximum thickness of the nitride portion 104D may be in a range of about 2:1 to about 3:1. It has been observed by forming a conformal nitride portion 104D, excess overhang on sidewalls of the opening may be avoided, eliminating the need for an etch back process to remove the nitride portion 104D from sidewalls of the opening, which increases manufacturing ease and reduces cost.

Figure 20B:
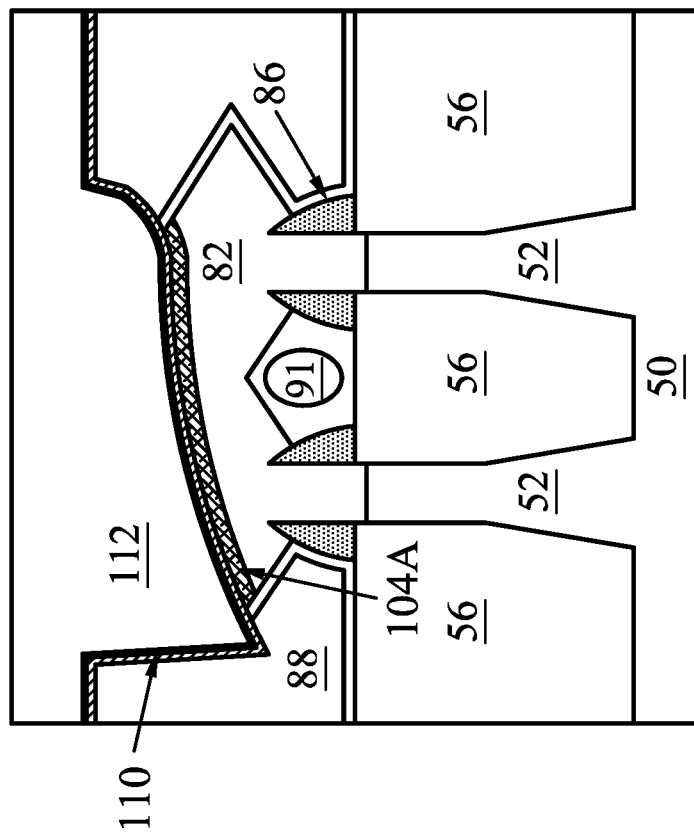
Figure 20A:
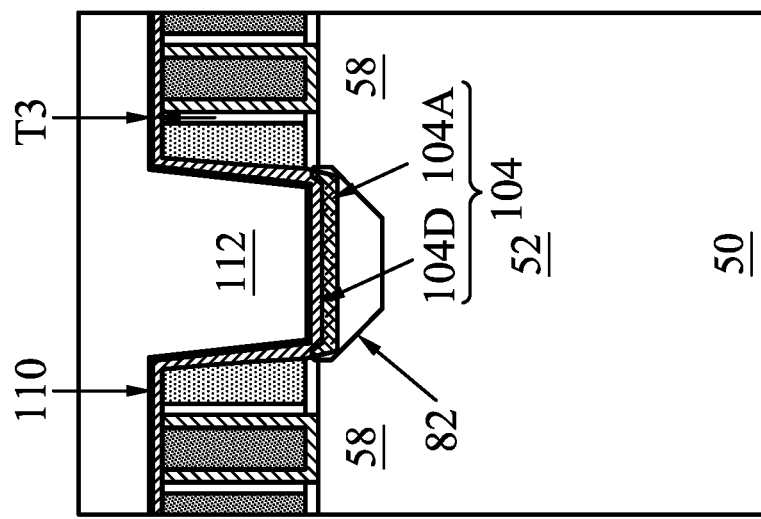

In FIGS. 20A and 20B, a liner 110 is deposited on the silicide 104. In some embodiments, the liner 110 may include a diffusion barrier layer, an adhesion layer, combinations thereof, or the like. The liner 110 may comprise titanium nitride, tantalum nitride, titanium oxide, tantalum oxide, combinations thereof, or the like, and the liner 110 may be deposited using a conformal process such as CVD, PECVD, ALD, or the like. The liner 110 may have a thickness T3, which may be in the range of about 1 nm to about 2 nm, such as about 1.2 nm.

As also illustrated in FIGS. 20A and 20B, a remaining portion of the opening 100 may be filled with a metal 112. The metal 112 may be formed, for example, by first depositing a seed layer (e.g., using CVD, PECVD, ALD, or the like) and then performing a plating process. The metal 112 may copper, a copper alloy, silver, gold, tungsten, cobalt, aluminum, nickel, or the like.

After plating, a planarization process, such as a CMP, may be performed to remove excess material from a surface of the ILD 88 and the gate stacks 98 as illustrated by FIGS. 21A and 21B. The remaining liner 110 and conductive material 112 form the source/drain contacts 114, which are electrically connected to the epitaxial source/drain regions 82 through the silicides 104. Because the silicides 104 were formed using conformal deposition processes, reduced source/drain contact resistance ($R_{csd}$) can be achieved. For example, $R_{csd}$ reductions of about 0.2 kΩ to about 0.4 kΩ per fin of a finFET transistor has been observed by including conformal silicides in both NMOS and PMOS finFET transistors.

In FIGS. 22A and 22B, a second ILD 120 is deposited over the first ILD 88. In some embodiment, the second ILD 120 is a flowable film formed by a flowable CVD method. In some embodiments, the second ILD 120 is formed of a dielectric material such as PSG, BSG, BPSG, USG, or the like, and may be deposited by any suitable method, such as CVD and PECVD. In accordance with some embodiments, before the formation of the second ILD 120, the gate stack 98 (including a gate dielectric layer 92 and a corresponding overlying gate electrode 94) is optionally recessed, so that a recess is formed directly over the gate stack and between opposing portions of gate spacers 86, as illustrated in FIGS. 22A and 22B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 penetrate through the gate mask 96 to contact the top surface of the recessed gate electrode 94. The recessing of the gate stack 98 and the formation of the gate mask 96 may be done prior to or after the formation of silicide 104 and/or source/drain contacts 114.

Gate contacts 118 and second level source/drain contacts 116 are formed through the second ILD 120 in accordance with some embodiments. Openings for the source/drain contacts 116 are formed through the second ILD 120, and openings for the gate contact 118 are formed through the second ILD 120 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 120. The remaining liner and conductive material form the source/drain contacts 116 and gate contacts 118 in the openings. The source/drain contacts 116 are physically and electrically coupled to the epitaxial source/drain regions 82 through the source/drain contacts 114, and the gate contacts 118 are physically and electrically coupled to the gate electrodes 94 of the gate stacks 98. The source/drain contacts 116 and gate contacts 118 may be formed in different processes, or may be formed in the same process. Although shown as being formed in the same cross-sections, it should be appreciated that each of the source/drain contacts 116 and gate contacts 118 may be formed in different cross-sections, which may avoid shorting of the contacts.

Figure 22C:
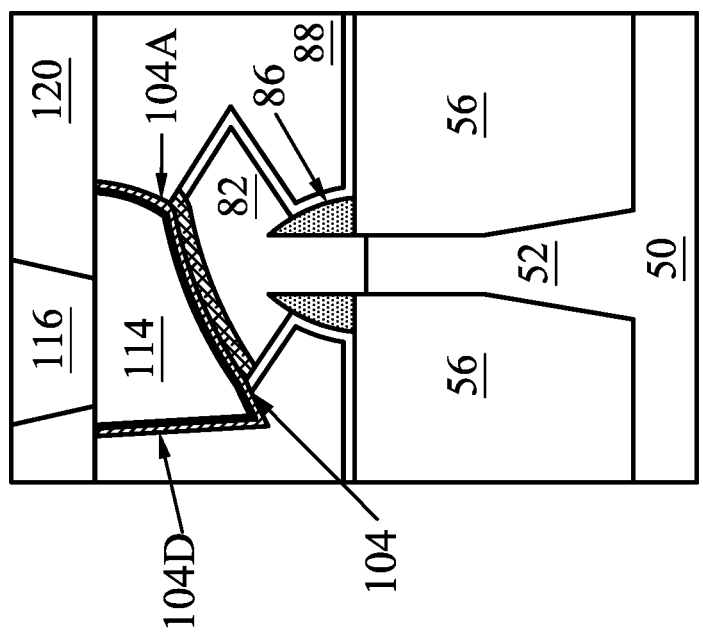

FIG. 22C illustrates an alternative embodiment where the source/drain contact 114 and the silicide 104 is formed on a single, unmerged epitaxial source/drain region 82. Various elements of FIG. 22C is similar to elements of FIG. 22B where like reference numerals indicate like elements formed using like processes. However, epitaxial source/drain region 82 is an unmerged source/drain region, which is not connected to any adjacent source/drain regions (e.g., regions grown on an adjacent fin).

Figure 25B:
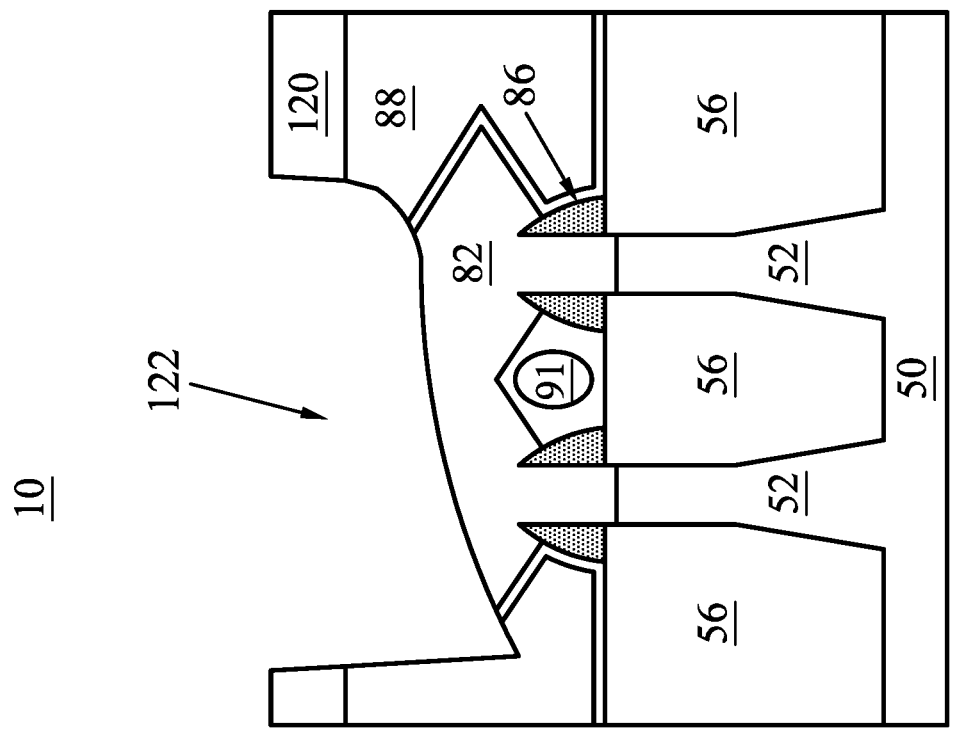
FIGS. 25A, 25B, 26A, and 26B are cross-sectional views of intermediate stages in the manufacturing of FinFETs, in accordance with some embodiments.
Figure 25A:
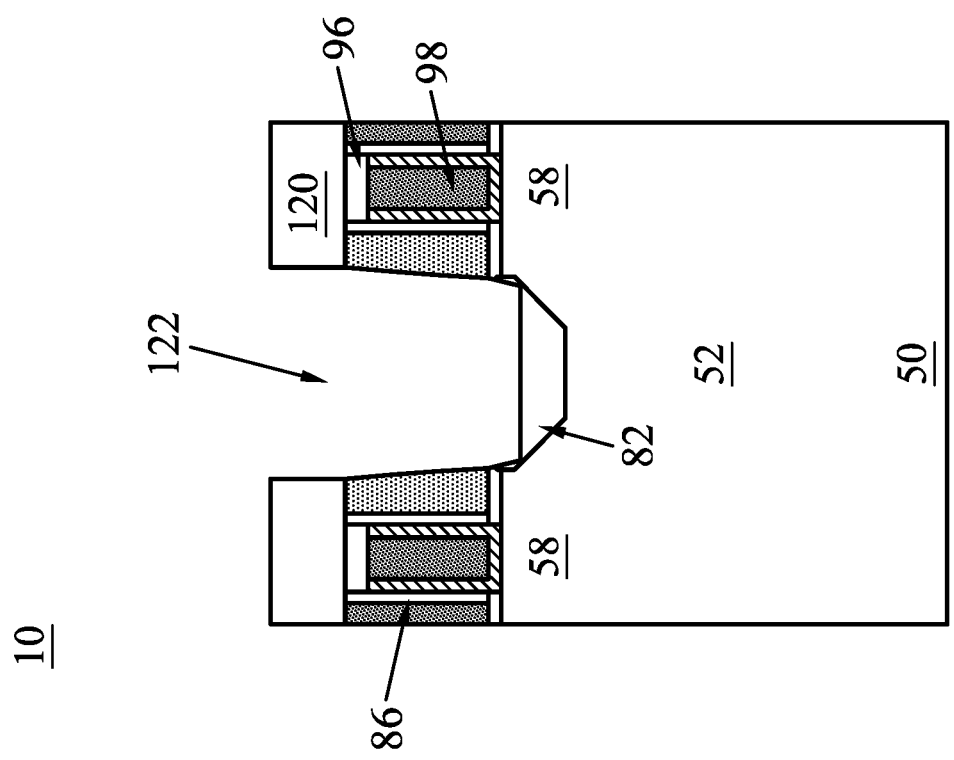

Various embodiment processes may also be used to form the silicide 104 and the source/drain contacts 114 after the second ILD 120 is deposited. For example, FIGS. 25A through 26B illustrate such an embodiment. FIGS. 25A and 25B are similar to corresponding FIGS. 16A and 16B where like reference numerals indicate like elements formed using like processes. However, in FIGS. 25A and 25B, a source/drain contact opening 122 is patterned through both the first ILD 88 and the second ILD 120 using acceptable photolithography and etching processes. In this embodiment, the opening 122 is patterned after the second ILD 120 is deposited. Further, although the second ILD 120 is illustrated as directly contacting the first ILD 88, one or more intermediary layers (e.g., etch stop layers) may be formed between the first ILD 88 and the second ILD 120. The opening 122 is etched through these intermediary layers.

Figures 26A, 26B:
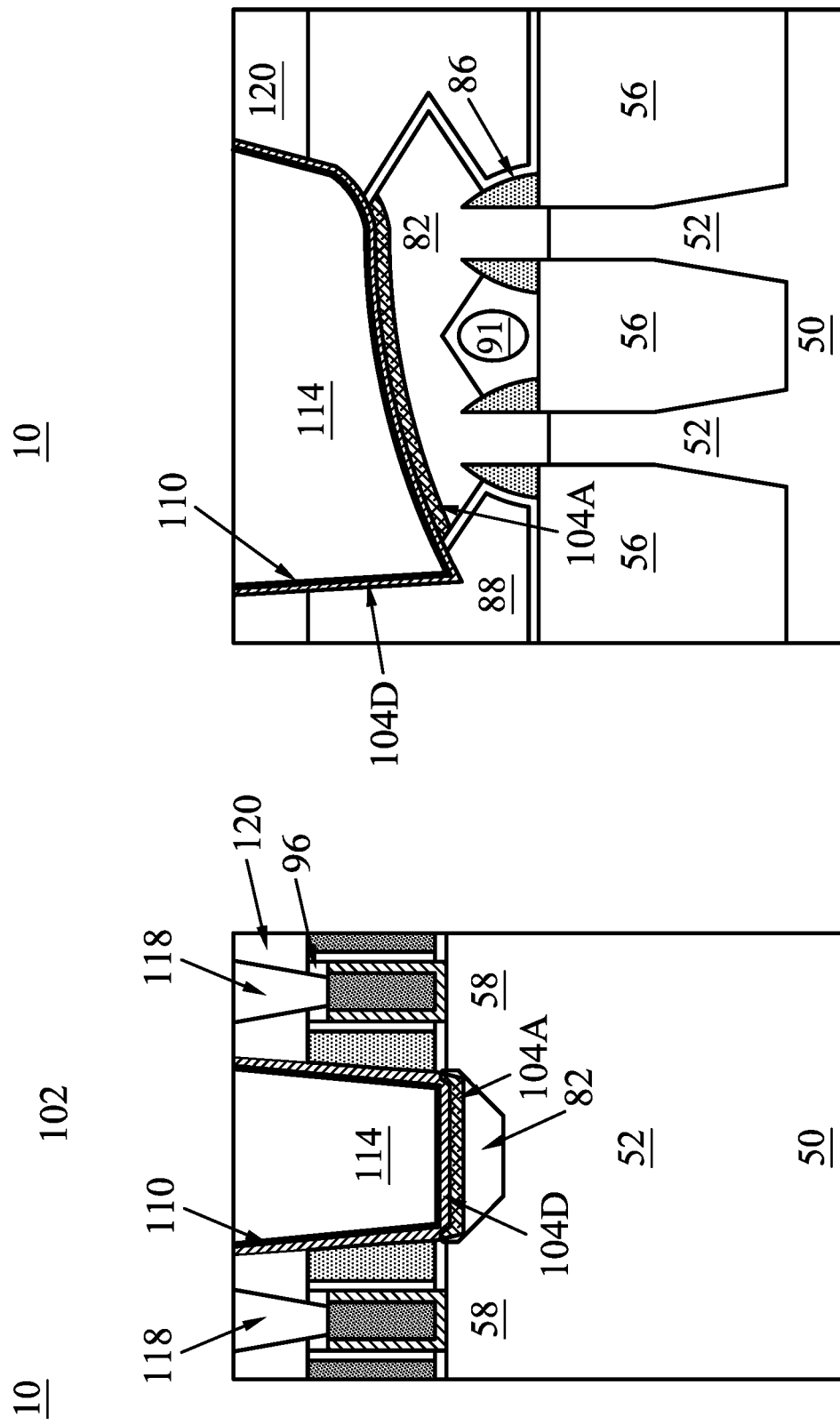

In FIGS. 26A and 26B, a silicide 104 (comprising a first portion 104A and a nitride portion 104D) is formed on exposed surfaces of the epitaixial source/drain region 82 using similar processes as described above with respect to FIGS. 17A through 19B. The nitride portion 104D of the silicide 104 may further be formed on sidewalls of the opening 122, such as on sidewalls of the gate spacers 86, sidewalls of the first ILD 88, and sidewalls of the second ILD 120. A source/drain contact 114 is formed on the silicide 104 using similar processes as described above with respect to FIGS. 20A through 22C. The source/drain contact 114 may include a conformal liner 110 in some embodiments.

Various embodiments described herein include a conformal silicide in a source/drain region. The conformal silicide may allow for reduced source/drain contact resistance ($R_{csd}$). For example, $R_{csd}$ reductions of about 0.2 kΩ to about 0.4 kΩ per fin of a finFET transistor has been observed by including conformal silicides in both NMOS and PMOS finFET transistors. The conformal silicide may be formed by depositing a metal (e.g., titanium, or the like) using a conformal deposition process. The conformal deposition process may include a plasma process, which may include a selective process in combination with a non-selective process. Due to the conformal deposition process, excess metal material overhang on sidewalls of source/drain contact openings can be controlled, eliminating a separate sidewall cleaning step to remove undesirable metal overhang. The metal may also be deposited at a sufficient temperature to intermix with a crystalline material of the source/drain region, which eliminates the need for a separate annealing step after deposition. Thus, embodiment methods may decrease manufacturing steps, which advantageously increases manufacturing efficiency and decreases cost.

In some embodiments, a device includes a gate stack; a gate spacer on a sidewall of the gate stack; a source/drain region adjacent the gate stack; a silicide comprising: a conformal first portion extending into the source/drain region, the conformal first portion comprising a metal and silicon; and a conformal second portion over the conformal first portion, the conformal second portion further disposed on a sidewall of the gate spacer, the conformal second portion comprising the metal, silicon, and nitrogen; and a source/drain contact electrically connected to the source/drain region through the silicide. In some embodiments, the metal is titanium, the conformal first portion comprises titanium silicon (TiSi), and the conformal second portion comprises titanium silicon nitrogen (TSN). In some embodiments, a thickness of the conformal first portion is in a range of 2 nm to 4 nm. In some embodiments, a thickness of the conformal second portion is in a range of 1 nm to 2 nm. In some embodiments, the source/drain contact comprises a liner; and a metal over the liner. In some embodiments, the silicide comprises chlorine. In some embodiments, the chlorine in the silicide is less than 0.5% atomic.

In some embodiments, a device includes a gate stack over a channel region of a transistor; a gate spacer on a sidewall of the gate stack; a source/drain region adjacent the channel region; a silicide extending into the source/drain region, the silicide comprising: a titanium silicon portion, wherein a ratio of a minimum thickness of the titanium silicon portion to a maximum thickness of the titanium silicon portion is in a range of 3.5:1 to 5:1; and a titanium silicon nitride portion on the titanium silicon portion, wherein a ratio of a minimum thickness of the titanium silicon nitride portion to a maximum thickness of titanium silicon nitride portion is in a range of 1:1 to 1.5:1; and a source/drain contact electrically connected to the source/drain region to the silicide. In some embodiments, the titanium silicon nitride portion extends above and along sides of the titanium silicon portion. In some embodiments, the titanium silicon nitride portion extends along sidewalls of the gate spacer. In some embodiments, the device further includes a first interlayer dielectric (ILD) around the gate stack, wherein the silicide extends along sidewalls of the first ILD. In some embodiments, the device further includes a second ILD over the first ILD and the gate stack, wherein the silicide extends along sidewalls of the second ILD.

In some embodiments, a method includes patterning an opening through an interlayer dielectric (ILD), wherein the opening exposes a surface of a source/drain region; forming a silicide in the opening, wherein forming the silicide comprises: performing a first conformal deposition process to form a first metal-comprising portion on the source/drain region; performing a second conformal deposition process to form a second metal-comprising portion on the first metal-comprising portion, wherein process parameters of the first conformal deposition process is different from the second conformal deposition process; and performing a passivation treatment on the second metal-comprising portion; and forming a source/drain contact in the opening over the silicide. In some embodiments, the first conformal deposition process and the second conformal deposition process are each performed at a temperature of at least 400° C. In some embodiments, no annealing process is performed between the second conformal deposition process and forming the source/drain contact. In some embodiments, the first conformal deposition process and the second conformal deposition process each comprise using a $TiCl_4$ precursor, wherein the first conformal deposition process comprises a first plasma process that converts a majority of the $TiCl_4$ precursor to $TiCl_3$, and wherein the second conformal deposition process comprises a second plasma process that converts a majority of the $TiCl_4$ precursor to $TiCl_2$. In some embodiments the second conformal deposition process has a higher power, pressure, gas flow, or a combination thereof than the first conformal deposition process. In some embodiments, performing the passivation treatment coverts the second metal-comprising portion to a nitride. In some embodiments, the method further includes performing a purging process to remove byproducts of the first conformal deposition process or the second conformal deposition process. In some embodiments the opening exposes a sidewall of a gate spacer, the second conformal deposition process forms the second metal-comprising portion on a sidewall of the gate spacer, and the second metal-comprising portion is not removed from the sidewalls of the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a gate stack;
    a gate spacer on a sidewall of the gate stack;
    a source/drain region adjacent the gate stack;
    a silicide comprising:
        a conformal first portion extending into the source/drain region, the conformal first portion comprising a metal and silicon; and
        a conformal second portion over the conformal first portion, the conformal second portion further disposed on a sidewall of the gate spacer, the conformal second portion comprising the metal, silicon, and nitrogen, wherein the silicide comprises chlorine; and
    a source/drain contact electrically connected to the source/drain region through the silicide.

2. The device of claim 1, wherein the metal is titanium, the conformal first portion comprises titanium silicon (TiSi), and the conformal second portion comprises titanium silicon nitrogen (TSN).

3. The device of claim 1, wherein a thickness of the conformal first portion is in a range of 2 nm to 4 nm.

4. The device of claim 1, wherein a thickness of the conformal second portion is in a range of 1 nm to 2 nm.

5. The device of claim 1, wherein the source/drain contact comprises:
    a liner; and
    a metal over the liner.

6. The device of claim 1, wherein the conformal first portion and the conformal second portion of the silicide each comprises chlorine.

7. The device of claim 6, wherein the chlorine in the silicide is less than 0.5% atomic.

8. A device comprising:
    a gate stack over a channel region of a transistor;
    a gate spacer on a sidewall of the gate stack;
    a source/drain region adjacent the channel region;
    a silicide extending into the source/drain region, the silicide comprising:
        a titanium silicon portion, wherein a ratio of a minimum thickness of the titanium silicon portion to a maximum thickness of the titanium silicon portion is in a range of 3.5:1 to 5:1; and
        a titanium silicon nitride portion on the titanium silicon portion, wherein a ratio of a minimum thickness of the titanium silicon nitride portion to a maximum thickness of titanium silicon nitride portion is in a range of 1:1 to 1.5:1; and
    a source/drain contact electrically connected to the source/drain region to the silicide.

9. The device of claim 8, wherein the titanium silicon nitride portion extends above and along sides of the titanium silicon portion.

10. The device of claim 8, wherein the titanium silicon nitride portion extends along sidewalls of the gate spacer.

11. The device of claim 8 further comprising a first interlayer dielectric (ILD) around the gate stack, wherein the silicide extends along sidewalls of the first ILD.

12. The device of claim 11 further comprising a second ILD over the first ILD and the gate stack, wherein the silicide extends along sidewalls of the second ILD.

13. A device comprising:
    a gate stack;
    a gate spacer on a sidewall of the gate stack;
    a source/drain region adjacent the gate stack;
    a contact etch stop layer over the source/drain region
    an interlayer dielectric (ILD) over the contact etch stop layer and around the source/drain region;
    a silicide over and extending into the source/drain region, the silicide comprising:
        a first portion extending into the source/drain region, the first portion comprising a metal and silicon, wherein the first portion extends along the contact etch stop layer; and
        a second portion over the first portion, the second portion further disposed on the sidewall of the gate spacer, the second portion comprising the metal, silicon, and nitrogen, wherein the second portion extends to a top surface of the ILD; and
    a source/drain contact electrically connected to the source/drain region through the silicide.

14. The device of claim 13, wherein the metal is titanium.

15. The device of claim 13, wherein a thickness of the first portion is in a range of 2 nm to 4 nm.

16. The device of claim 15, wherein a thickness of the second portion is in a range of 1 nm to 2 nm.

17. The device of claim 13 further comprising a dielectric layer on the ILD, wherein the second portion extends to a top surface of the dielectric layer.

18. The device of claim 13, wherein the second portion lines sidewalls of the source/drain contact.

19. The device of claim 18, wherein the source/drain contact comprises:
    a barrier layer on the second portion of the silicide; and
    a fill metal on the barrier layer.

20. The device of claim 13, wherein the silicide comprises chlorine.

* * * * *